United States Patent
Seo et al.

(10) Patent No.: US 10,069,044 B2
(45) Date of Patent: Sep. 4, 2018

(54) MICROCAPSULAR QUANTUM DOT-POLYMER COMPOSITE, METHOD FOR PRODUCING THE COMPOSITE, OPTICAL ELEMENTS, AND METHOD FOR PRODUCING THE OPTICAL ELEMENTS

(71) Applicant: Industry-Academia Cooperation Group of Sejong University, Seoul (KR)

(72) Inventors: Young Soo Seo, Seoul (KR); Hee Sung Yang, Seongnam-si (KR); Sang Yul Park, Seoul (KR); Hye Mi Son, Seoul (KR); Hyo Sun Kim, Seoul (KR)

(73) Assignee: INDUSTRY-ACADEMIA COOPERATION GROUP OF SEJONG UNIV, Seoul (KR)

( * ) Notice: Subject to any disclaimer, the term of this patent is extended or adjusted under 35 U.S.C. 154(b) by 921 days.

(21) Appl. No.: 14/385,758

(22) PCT Filed: Mar. 15, 2013

(86) PCT No.: PCT/KR2013/002124
§ 371 (c)(1),
(2) Date: Nov. 26, 2014

(87) PCT Pub. No.: WO2013/137689
PCT Pub. Date: Sep. 19, 2013

(65) Prior Publication Data
US 2015/0072092 A1 Mar. 12, 2015

(30) Foreign Application Priority Data

Mar. 16, 2012 (KR) .................. 10-2012-0027039
Feb. 18, 2013 (KR) .................. 10-2013-0016841
Feb. 18, 2013 (KR) .................. 10-2013-0016859

(51) Int. Cl.
H01L 33/50 (2010.01)
C09K 11/02 (2006.01)
(Continued)

(52) U.S. Cl.
CPC ............ *H01L 33/502* (2013.01); *C09K 11/02* (2013.01); *C09K 11/565* (2013.01);
(Continued)

(58) Field of Classification Search
CPC ......... H01L 33/502; H01L 2224/48091; H01L 2224/48227; H01L 2224/48237;
(Continued)

(56) References Cited

U.S. PATENT DOCUMENTS

| 3,892,717 A | 7/1975 | Mori et al. | |
| 6,319,426 B1 * | 11/2001 | Bawendi | B82Y 15/00 |
| | | | 252/301.4 R |

(Continued)

FOREIGN PATENT DOCUMENTS

| EP | 0304245 A1 | 2/1989 |
| JP | 2011-142336 A | 7/2011 |

(Continued)

OTHER PUBLICATIONS

International Search Report dated Jun. 19, 2013 of PCT/KR2013/002124 which is the parent application and its English translation—4 pages.

(Continued)

*Primary Examiner* — Ling Siu Choi
*Assistant Examiner* — Ronald Grinsted
(74) *Attorney, Agent, or Firm* — Knobbe Martens Olson & Bear LLP

(57) ABSTRACT

There are provided a microcapsular quantum dot-polymer composite, a method for producing the composite, optical elements, and a method for producing the optical elements.

(Continued)

In order to produce the microcapsular quantum dot-polymer composite, a polymer having a functional group in the side chain is firstly heated in a first solvent to form a polymer solution. A quantum dot suspension consisting of quantum dots capped by a capping layer dispersed in a second solvent is added to the polymer solution to form a mixed solution. The mixed solution is cooled to form the quantum dot-polymer composite consisting of the quantum dots dispersed in the polymer matrix.

20 Claims, 21 Drawing Sheets

(51) Int. Cl.
  *C09K 11/56* (2006.01)
  *C09K 11/88* (2006.01)
  *H01L 23/00* (2006.01)

(52) U.S. Cl.
  CPC .. *C09K 11/883* (2013.01); *H01L 2224/48091* (2013.01); *H01L 2224/48227* (2013.01); *H01L 2224/48237* (2013.01); *H01L 2924/181* (2013.01); *H01L 2933/0041* (2013.01); *Y10T 428/1393* (2015.01); *Y10T 428/31801* (2015.04)

(58) Field of Classification Search
  CPC ...... H01L 2924/181; H01L 2933/0041; C09K 11/02; C09K 11/565; C09K 11/883; Y10T 428/1393; Y10T 428/31801
  USPC ...................................... 428/36.91
  See application file for complete search history.

(56) References Cited

U.S. PATENT DOCUMENTS

| | | |
|---|---|---|
| 2006/0208223 A1 | 9/2006 | Chen et al. |
| 2006/0217478 A1 | 9/2006 | Denisyuk et al. |
| 2007/0225402 A1 | 9/2007 | Choi et al. |
| 2008/0012031 A1 | 1/2008 | Jang et al. |
| 2011/0068321 A1 | 3/2011 | Pickett et al. |
| 2011/0068322 A1 | 3/2011 | Pickett et al. |
| 2012/0004345 A1 | 1/2012 | Chun et al. |
| 2012/0113672 A1 | 5/2012 | Dubrow et al. |

FOREIGN PATENT DOCUMENTS

| | | |
|---|---|---|
| KR | 91-4092 B1 | 6/1991 |
| KR | 10-2007-0113321 A | 11/2007 |
| KR | 10-2008-0006906 A | 1/2008 |
| KR | 2009-0033947 A | 4/2009 |
| WO | 2011/031871 A1 | 3/2011 |
| WO | 2011/036447 A1 | 3/2011 |

OTHER PUBLICATIONS

Shandryuk et al., "Effect of H-Bonded Liquid Crystal Polymers on CdSe Quantum Dot Alignment within anocomposite", Macromolecules, 2008, vol. 41, pp. 2178-2185

Mattoussi et al., "Composite thin films of CdSe nanocrystals and a surface passivating/electron transporting block copolymer:Correlations between film microstructure by transmission electron microscopy and electroluminescence", Journal of Applied Physics, 1999, vol. 86, No. 8, pp. 4390-4399

Lei Shen, "Biocompatible Polymer/Quantum Dots Hybrid Materials: Current Status and Future Developments", Journal of Functional Biomaterials, 2011, vol. 2, pp. 355-372.

Wood et al., "Colloidal quantum dot light-emitting devices", Nano Review, 2010, vol. 1, 5202.

Boulmedais, et al., "Water-Soluble Pegylated Quantum Dots: From a Composite Hexagonal Phase to Isolated Micelles", Langmuir, 2006, vol. 22, pp. 9797-9803.

* cited by examiner

I - I'

MICROCAPSULAR QUANTUM DOT-POLYMER COMPOSITE, METHOD FOR PRODUCING THE COMPOSITE, OPTICAL ELEMENTS, AND METHOD FOR PRODUCING THE OPTICAL ELEMENTS

BACKGROUND

1. Field of the Invention

The present invention relates to a quantum dot, and more specifically, to a microcapsular quantum dot-polymer composite.

2. Discussion of Related Art

Since a quantum dot is a semiconductor particle having a core or core-shell structure which is a few nanometers in size, and quantum dots emit light in various wavelength ranges through energy obtained from excitation according to a size of the particle, it is effectively used for applications, especially, in the field of LED lighting. For applications of the quantum dot in the field of LEDs, the quantum dot is typically dispersed in a resin solution for use.

However, it has been known that the quantum dots have low dispersibility due to a strong aggregation tendency of the particles, and thus, quantum efficiency decreases. Further, quantum efficiency also decreases due to a physicochemical conversion of the quantum dots when the quantum dots are exposed to an oxidizing environment such as oxygen or moisture, or under a high temperature condition. In order to reduce aggregation of the quantum dots, there have been attempts to prevent aggregation of the quantum dots to increase stability of the quantum dot by covalent bonding with ligands such as tri-n-octylphosphine oxide (TOPO), oleic acid, stearic acid, palmitic acid, octadecylamine, hexadecylamine, or the like on the surface of the quantum dot (refer to U.S. Pat. No. 7,056,471, etc.). However, when the quantum dots are dispersed in a curable resin solution, aggregation of the quantum dots may occur, or quantum efficiency may decrease, and quantum efficiency may continuously decrease after curing resins.

Further, according to the result of an accelerated life test, which is a test method of measuring long term stability of the quantum dots in the curable resin necessary for practical use of the quantum dots in applications for LED, or the like, it has been known that quantum efficiency rapidly decreases according to processing time. Consequently, a commercial application of the quantum dots is limited.

SUMMARY OF THE INVENTION

The present invention is directed to providing a quantum dot-polymer composite having excellent quantum dot dispersibility and capable of maintaining quantum efficiency stably for a long term.

The present invention is also directed to providing a quantum dot-polymer composite having high thermal resistance.

To provide the above quantum dot-polymer composite, one aspect of the present invention provides an embodiment of a method of producing a microcapsular quantum dot-polymer composite. A polymer solution is prepared by heating a polymer having a polar functional group in a side chain in a first solvent. A mixed solution is prepared by adding a quantum dot suspension in which quantum dots capped by capping layers are dispersed in a second solvent into the polymer solution. The mixed solution is cooled, and thereby quantum dot-polymer composites in which the quantum dots are dispersed in polymer matrices are prepared.

The polymer having a polar functional group in the side chain may be a crystalline polymer. The polymer having a polar functional group in the side chain may have a softening point in a range of 70 to 200° C. The polar functional group may be a functional group including an oxygen moiety. The oxygen moiety may be —OH, —COOH, —COH, —O—, or —CO.

The polymer having a polar functional group in the side chain may be a partially oxidized polymer. A main side of the polymer having a polar functional group in the side chain may be a polymer selected from the group consisting of polyolefins, polyesters, polycarbonates, polyamides, polyimides, and combinations thereof. The polymer having a polar functional group in the side chain may be a polymer selected from the group consisting of partially oxidized polyolefins, partially oxidized polystyrenes, partially oxidized polyesters, partially oxidized polycarbonates, partially oxidized polyamides, partially oxidized polyimides, and combinations thereof. The polymer having a polar functional group in the side chain may be a partially oxidized polyolefin wax.

The polymer having a polar functional group in the side chain may be a copolymer of polymaleic anhydride and a polymer selected from the group consisting of polyolefins, polystyrenes, polyesters, polycarbonates, polyamides, polyimides, and combinations thereof. In an embodiment, the polymer having a polar functional group in the side chain may be a polyolefin-polymaleic anhydride copolymer wax.

The polymer having a polar functional group in the side chain may have an acid value of 1 to 100 mgKOH/g. Specifically, the polymer having a polar functional group in the side chain may have an acid value of 3 to 40 mgKOH/g. The polymer having a polar functional group in the side chain may have a crosslinkable substituent.

A high-molecular-weight polymer having a higher average molecular weight than the polymer having a polar functional group in the side chain may be added to the first solvent to prepare the polymer solution. The high-molecular-weight polymer may be the same as a main chain of the polymer having a polar functional group in the side chain. The high-molecular-weight polymer may be a low density polyethylene (LDPE) or a high density polyethylene (HDPE). The high-molecular-weight polymer may be included at 5 to 30 parts by weight with respect to 100 parts by weight of the polymer having a polar functional group in the side chain.

The first solvent and the second solvent may be the same. The first solvent and the second solvent may be non-polar solvents. In an embodiment, the first solvent and the second solvent may be benzene, xylene, toluene, cyclohexane, or carbon tetrachloride, regardless of each other.

In a process of preparing the polymer solution, a heat temperature may be about 90 to 130° C. A cooling rate of the polymer solution may be 1 to 200° C./min.

A passivation layer of an inorganic material may be formed on a surface of the quantum dot-polymer composite. The inorganic material may be inorganic particles. The inorganic particles may be inorganic particles selected from the group consisting of titanium oxide, silicon oxide, aluminum oxide, graphene, graphene oxide, and carbon nanotubes.

To provide the above quantum dot-polymer composite, another aspect of the present invention provides a microcapsular quantum dot-polymer composite. The microcapsular quantum dot-polymer composite may include a polymer matrix containing the polymer having a polar functional group in a side chain. The quantum dots capped by the capping layer are dispersed in the polymer matrix.

The polymer having a polar functional group in the side chain may be a crystalline polymer. The polymer having a polar functional group in the side chain may be a partially oxidized polyolefin wax or a polyolefin-polymaleic anhydride copolymer wax. The polymer having a polar functional group in the side chain may have an acid value of 3 to 40 mgKOH/g. The polymer having a polar functional group in the side chain may have a crosslinkable substituent. The polymer matrix may further include a high-molecular-weight polymer having a higher average molecular weight than the polymer having a polar functional group in the side chain. The high-molecular-weight polymer may be the same as a main chain of the polymer having a polar functional group in the side chain. The high-molecular-weight polymer may be an LDPE or an HDPE. The high-molecular-weight polymer may be included at 5 to 30 parts by weight with respect to 100 parts by weight of the polymer having a polar functional group in the side chain.

The inorganic particles may be disposed on the surface of the quantum dot-polymer composite.

To provide the above quantum dot-polymer composite, still another aspect of the present invention provides a method of producing optical devices. First, a base substrate is provided. Then, a suspension in which microcapsular quantum dot-polymer composites are dispersed is provided on the base substrate. The microcapsular quantum dot-polymer composite has a polymer matrix containing a polymer having a polar functional group in a side chain, and quantum dots capped by a capping layer are dispersed in the polymer matrix.

The base substrate may be a plate-type substrate. Here, providing the suspension on a surface of the base substrate may denote coating the suspension on an upper surface of the base substrate. On the other hand, the base substrate may be a tube-type substrate, and providing the suspension on a surface of the base substrate may denote coating the suspension on an inner surface of the base substrate using a capillary phenomenon.

Further, the base substrate may be a substrate on which a light emitting diode is mounted. Here, the providing of the suspension on the base substrate may denote providing a mixed solution in which a sealing resin is mixed with the suspension on the base substrate. The sealing resin may be a resin selected from the group consisting of epoxy resins, phenol resins, polyesters, silicone resins, acrylate resins, urethane-acrylate resins and combinations thereof. The polymer having a polar functional group in the side chain may have a crosslinkable substituent. In this case, the crosslinkable substituent may also be cured at the same time in which the sealing resin is cured. Further, after providing the suspension on the base substrate, curing the polymer having a polar functional group in the side chain may be additionally performed.

The polymer matrix may further include a high-molecular-weight polymer having a higher average molecular weight than the polymer having a polar functional group in the side chain. The high-molecular-weight polymer may be an LDPE or an HDPE.

To provide the above quantum dot-polymer composite, yet still another aspect of the present invention provides an optical device. The optical device includes a base substrate. An optical conversion layer is disposed on the base substrate. The optical conversion layer includes microcapsular quantum dot-polymer composites. Each of the quantum dot-polymer composites includes a polymer matrix containing a polymer having a polar functional group in a side chain, and quantum dots capped by capping layers dispersed in the polymer matrix.

The base substrate may be a light transmitting polymer film, or a glass substrate. The base substrate may be in a plate shape, and the optical conversion layer may be disposed on the upper surface of the base substrate. On the other hand, the base substrate may be in a tube shape, and the optical conversion layer may be disposed on the inner surface of the base substrate.

Further, the base substrate may be a substrate on which a light emitting diode is mounted. Here, the optical conversion layer may be a layer in which the quantum dot-polymer composites are dispersed in a sealing resin. The sealing resin may be a resin selected from the group consisting of epoxy resins, phenol resins, polyester, silicone resins, acrylate resins, urethane-acrylate resins and combinations thereof. The polymer having a polar functional group in the side chain may have a crosslinkable substituent, and the polymer having a polar functional group in the side chain may be cured through the crosslinkable substituent.

The polymer matrix may further include a high-molecular-weight polymer having a higher average molecular weight than the polymer having a polar functional group in the side chain. The high-molecular-weight polymer may be an LDPE or an HDPE.

To provide the above quantum dot-polymer composite, yet still another aspect of the present invention provides another embodiment of an optical device. The optical device includes a base substrate. An optical conversion layer is disposed on one surface of the base substrate. The optical conversion layer has polymer microparticles which contain polymers having polar functional groups in side chains, and quantum dots positioned outside the polymer microparticles. The polymer microparticle may be passivated by a passivation layer of an inorganic material. The polymer microparticle may further include a high-molecular-weight polymer having a higher average molecular weight than the polymer having a polar functional group in the side chain. The base substrate is a substrate on which a light emitting diode is mounted, and the optical conversion layer may be a layer in which the polymer microparticles and the quantum dots are dispersed in a sealing resin. Phosphors dispersed in the sealing resin may be further included.

To provide the above quantum dot-polymer composite, yet still another aspect of the present invention provides another embodiment of a method of producing optical devices. First, the base substrate is provided. Then, a suspension in which polymer microparticles which contain polymers having polar functional groups in side chains, and quantum dots positioned outside the polymer microparticles are dispersed is provided on one surface of the base substrate.

To provide the above quantum dot-polymer composite, yet still another aspect of the present invention provides a method of producing polymer microparticles. First, a polymer solution is formed by heating a polymer having a polar functional group in a side chain in a solvent. The polymer solution is cooled, and then polymer microparticles are obtained. A passivation layer of an inorganic material may be formed on a surface of the polymer microparticle. The polymer solution may be formed by further adding a high-molecular-weight polymer having a higher average molecular weight than the polymer having a polar functional group in the side chain to the solvent.

To provide the above quantum dot-polymer composite, yet still another aspect of the present invention provides polymer microparticles. The polymer microparticle has a polymer matrix which contains a polymer having polar functional groups and which is crystalline, and has a shape of an ellipsoidal solid. The polymer having a polar functional group in the side chain may be a partially oxidized polyolefin wax. A passivation layer of an inorganic material may be formed on a surface of the polymer microparticle. The polymer matrix may further include a high-molecular-weight polymer having a higher average molecular weight than the polymer having a polar functional group in the side chain.

DETAILED DESCRIPTION OF EXEMPLARY EMBODIMENTS

Figure 1:
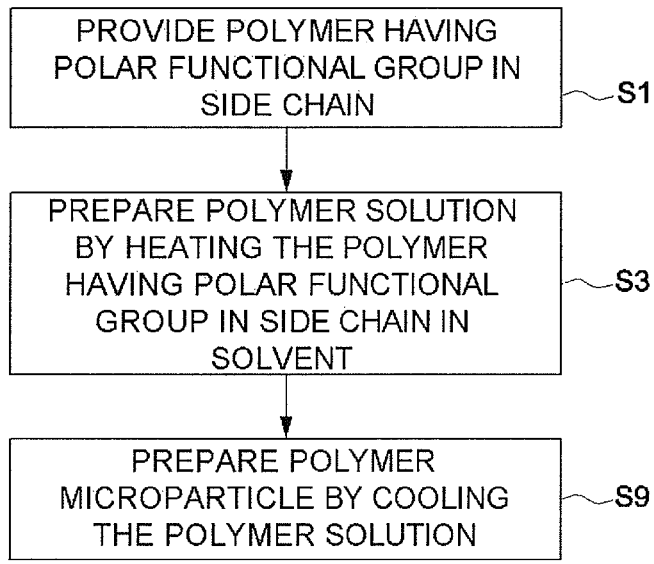
FIG. 1 is a flow chart illustrating a method of producing polymer microparticles according to an exemplary embodiment of the present invention.

Hereinafter, exemplary embodiments of the present invention will be described in detail. However, the present invention is not limited to the exemplary embodiments disclosed below, but can be implemented in various forms. The following exemplary embodiments are described in order to enable those of ordinary skill in the art to embody and practice the invention. Like reference numerals refer to like elements throughout the specification.

It will be understood that, in the present specification, when a layer is referred to as being "on" another layer, it may indicate that the layer is directly on the other layer or that another layer(s) is present there between.

FIG. 1 is a flow chart illustrating a method of producing polymer microparticles according to an embodiment of the present invention.

Referring to FIG. 1, a polymer having a polar functional group in a side chain is provided (S1).

A main chain of the polymer having a polar functional group in the side chain may include, for an example, a polymer selected from the group consisting of polyolefins, polyesters, polycarbonates, polyamides, polyimides, and combinations thereof. Specifically, the main chain of the polymer having a polar functional group in the side chain may be a homopolymer selected from the group consisting of polyolefins, polyesters, polycarbonates, polyamides, polyimides, and combinations thereof, or a copolymer including two or more selected from the group consisting of polyolefins, polyesters, polycarbonates, polyamides, polyimides, and combinations thereof. Further, the main chain of the polymer having a polar functional group in the side chain may be a crystalline polymer, and, for example, may be a polyolefin such as a polyethylene, a polypropylene, etc.

The polymer having a polar functional group in the side chain may have an acid value depending on a ratio of the polar functional group, for example, an acid value in a range of about 1 to about 100 mgKOH/g, specifically, in a range of about 3 to about 40 mgKOH/g. Further, the polymer having a polar functional group in the side chain may be a wax having a certain molecular weight distribution. The polymer may be a substance having a softening point distribution between about 70 to about 200° C., for example, about 70 to about 160° C., and as another example, about 80 to about 150° C. The polar functional group may contain an oxygen moiety. In the embodiment, the oxygen moiety may be —OH, —COOH, —COH, —O—, —CO, etc.

The polymer having a polar functional group in the side chain may be a partially oxidized polymer. The partially oxidized polymer, as a polymer in which an oxygen moiety is introduced irregularly into a main chain or side chain, may include a polymer selected from the group consisting of partially oxidized polyolefins, partially oxidized polystyrenes, partially oxidized polyesters, partially oxidized polycarbonates, partially oxidized polyamides, partially oxidized polyimides, and combinations thereof. Specifically, the partially oxidized polymer may be a partially oxidized polyolefin which is a crystalline polymer. The partially oxidized polyolefin may be selected from the group consisting of partially oxidized polyethylenes, partially oxidized polypropylenes, and combinations thereof. The partially oxidized polyethylene may be a partially oxidized polyolefin wax having a certain molecular weight distribution, for example, a partially oxidized polyethylene wax or a partially oxidized polypropylene wax. The partially oxidized polyolefin wax may be a substance having a softening point distribution between about 70 to about 200° C., for example, about 70 to about 160° C., and as another example, about 80 to about 150° C.

The polymer having a polar functional group in the side chain may be a copolymer of polymaleic anhydride and a polymer selected from the group consisting of polyolefins, polystyrenes, polyesters, polycarbonates, polyamides, polyimides, and combinations thereof, for example, a polyethylene-polymaleic anhydride copolymer, a polypropylene-polymaleic anhydride copolymer, or a polystyrene-polymaleic anhydride copolymer. Specifically, the polymer having a polar functional group in the side chain may be a polyolefin-polymaleic anhydride copolymer wax having a certain molecular weight distribution, for example, a polyethylene-polymaleic anhydride copolymer wax, a polypropylene-polymaleic anhydride copolymer wax, or a polystyrene-polymaleic anhydride copolymer wax, and may be a substance having a softening point distribution between about 70 to about 200° C., for example, about 70 to about 160° C., and as another example, about 80 to about 150° C.

The polymer having a polar functional group in the side chain may further have a crosslinkable substituent. In the embodiment, the polymer may include a cyclic ether such as an epoxide or oxetane, an isocyanate, an acrylate or a thiol in a side chain. Specifically, when the polar functional group includes an oxygen moiety such as —OH, —COOH, or the like, a part of the —OH group and/or a part of the —COOH group of the polymer may be substituted for a cyclic ether such as an epoxide or oxetane, an isocyanate, an acrylate or a thiol.

The polymer having a polar functional group in the side chain is heated in a solvent to prepare a polymer solution (S3).

The solvent may be a solvent which may dissolve the polymer having a polar functional group in the side chain at a temperature in a specific range. In the embodiment, when the polymer is non-polar, the solvent may be a non-polar solvent. The solvent may be benzene, xylene, toluene, cyclohexane, or carbon tetrachloride.

A high-molecular-weight polymer having a higher average molecular weight than the polymer having a polar functional group in the side chain may be added to the solvent. The high-molecular-weight polymer may include, for example, a polymer selected from the group consisting of polyolefins, polyesters, polycarbonates, polyamides, polyimides, and combinations thereof. The high-molecular-weight polymer may not have a polar functional group in the side chain, and may be the same type of polymer as a main chain of the polymer having a polar functional group in the side chain. In the embodiment, when a main chain of the polymer having a polar functional group in the side chain is a polyolefin such as a polyethylene, a polypropylene, or the like, the high-molecular-weight polymer may be a polyethylene, that is, a low density polyethylene (LDPE) or a high density polyethylene (HDPE). A melting index related to an average molecular weight of the high-molecular-weight polymer may be 10 to 70 g/min (at 190° C./2.16 kg). In the polymer solution, the high-molecular-weight polymer may be included at 5 to 30 parts by weight with respect to 100 parts by weight of the polymer having a polar functional group in the side chain.

The polymer may be insoluble in the solvent at room temperature. Therefore, by heating the polymer in the solvent, the polymer may be dissolved in the solvent, and thereby a polymer solution may be prepared. Here, the heat temperature may be about 80 to about 130° C. so that the polymer may be fully dissolved.

Subsequently, polymer microparticles are prepared by cooling the polymer solution (S9). In the cooling process, the polymers having polar functional groups in side chains may form polymer microparticles having a polymer matrix in which at least one portion is crystalline, through recrystallization or self-assembling. In the recrystallization, an oxygen moiety, as an example of the polar functional group in the side chain of the polymer, may increase a self-assembling rate of the polymer.

The temperature of the mixed solution after cooling may be room temperature. When the mixed solution is cooled, a cooling rate may be about 1 to about 200° C./min. This is because a shape or size of the produced microparticles may vary depending on the cooling rate (or a concentration of the solution). When the high-molecular-weight polymer is added, in the cooling process, the high-molecular-weight polymer may also be recrystallized or self-assembled.

The operations described above may be performed using a continuous reactor. In the embodiment, the preparation of the polymer solution (S3) may be performed in a high temperature solution tank, the preparation of the polymer microparticles by cooling the polymer solution (S9) may be performed in a cooling tank, recovery of the polymer microparticles may be performed in a recovery tank, and the high temperature solution tank, the cooling tank, and the recovery tank may be interconnected to constitute the continuous reactor.

Figure 2:
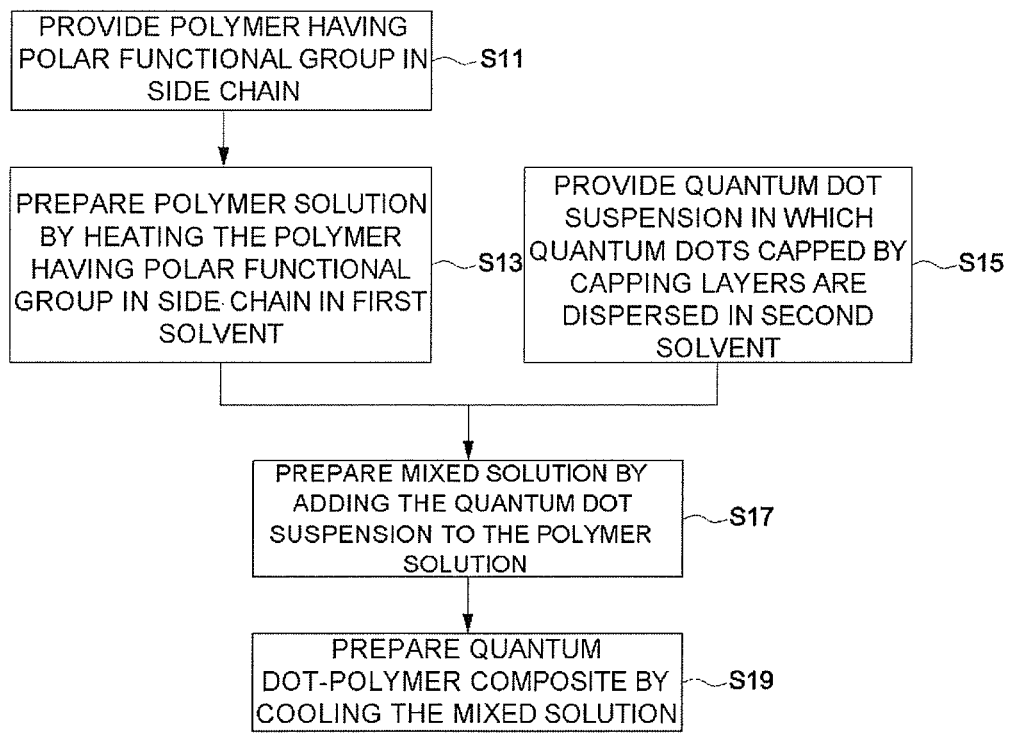
FIG. 2 is a flow chart illustrating a method of producing quantum dot-polymer composites according to an exemplary embodiment of the present invention.

FIG. 2 is a flow chart illustrating a method of producing quantum dot-polymer composites according to an embodiment of the present invention. The production method according to the embodiment is similar to the production method described in reference to FIG. 1 except for the following descriptions.

Referring to FIG. 2, a polymer having a polar functional group in a side chain is provided (S11). For the polymer having a polar functional group in the side chain, the description in reference to FIG. 1 may be referred to.

A polymer solution is prepared by heating the polymer having a polar functional group in the side chain in a first solvent (S13). A polymer having a higher average molecular weight than the polymer having a polar functional group in the side chain, which is a high-molecular-weight polymer, may be added to the first solvent. For the high-molecular-weight polymer, the description in reference to FIG. 1 may be referred to.

The first solvent may be a solvent which may dissolve the polymer at a temperature in a specific range. In the embodiment, when the polymer is non-polar, the solvent may be a non-polar solvent. The solvent may be benzene, xylene, toluene, cyclohexane, or carbon tetrachloride.

The polymer may be insoluble in the solvent at room temperature. Therefore, by heating the polymer in the first solvent, the polymer may be dissolved in the first solvent, and thereby a polymer solution may be prepared. Here, the heat temperature may be about 80 to about 130° C. so that the polymer may be fully dissolved. Further, a concentration of the polymer in the polymer solution may be 0.1 to 100 mg/ml.

Further, a quantum dot suspension in which quantum dots capped by capping layers are dispersed in a second solvent is provided (S15).

The quantum dot may have a single layered structure or a multilayered structure in a core-shell type. Each layer of the quantum dot may include one or more selected from the group consisting of CdS, CdO, CdSe, CdTe, ZnS, ZnO, ZnSe, ZnTe, MnS, MnO, MnSe, MnTe, MgO, MgS, MgSe, MgTe, CaO, CaS, CaSe, CaTe, SrO, SrS, SrSe, SrTe, BaO, BaS, BaSe, BaTe, HgO, HgS, HgSe, HgTe, $Al_2O_3$, $Al_2S_3$, $Al_2Se_3$, $Al_2Te_3$, $Ga_2O_3$, $Ga_2S_3$, $Ga_2Se_3$, $Ga_2Te_3$, $In_2O_3$, $In_2S_3$, $In_2Se_3$, $In_2Te_3$, $SiO_2$, $GeO_2$, $SnO_2$, SnS, SnSe, SnTe, PbO, $PbO_2$, PbS, PbSe, PbTe, AlN, AlP, AlAs, AlSb, GaN, GaP, GaAs, GaSb, InN, InP, InAs, InSb, BP, Si, Ge, and combinations thereof.

The capping layer may be a layer of ligands forming a chemical bond, for example, a coordinate bond on a surface of the quantum dot, and may prevent aggregation of the quantum dots in the solvent. The capping layer may be a layer of a material selected from the group consisting of phosphine oxides, organic amines, organic acids, and phosphonic acids, and combinations thereof, wherein the material has a non-polar long chain alkyl or aryl group. In the embodiment, the capping layer may be a material layer selected from the group consisting of tri-n-octylphosphine oxide (TOPO), stearic acid, palmitic acid, octadecylamine, hexadecylamine, dodecylamine, lauric acid, oleic acid, hexylphosphonic acid, and combinations thereof.

The second solvent may be a solvent which may disperse the capped quantum dots.

Thereafter, a mixed solution is prepared by adding the quantum dot suspension to the polymer solution (S17). In the mixed solution, a weight ratio of the quantum dots and the polymers may be between 1:1000 and 1:1.

A temperature of the mixed solution may be about 150° C. or less so as to prevent the quantum dots from being damaged. However, in order to fully dissolve the polymers in the mixed solution, the temperature of the mixed solution may be about 80° C. or more. The polymers may be dissolved in the mixed solution, and the quantum dots including the capping layer may also show good dispersibility. As a result, the quantum dots and the polymers may be mixed well in the mixed solution.

For this, the first and second solvents may be solvents which may have miscibility in a temperature range of the mixed solution.

In the embodiment, the first and second solvents may be common solvents which may dissolve the polymers, and at the same time, the capping layers of the quantum dots. Specifically, when a material forming the capping layer and the polymers is non-polar, the common solvents may be non-polar solvents. Here, the first and second solvents may be benzene, xylene, toluene, cyclohexane, or carbon tetrachloride, regardless of each other. Further, the first and second solvents may be the identical solvents, for example, toluene.

In another embodiment, the first and second solvents may be not the common solvents, or may not have the same polarity, as long as they can be mixed. Here, the first solvent may be a non-polar solvent, for example, such as benzene, xylene, toluene, cyclohexane, or carbon tetrachloride, and the second solvent may be ethanol, N-methyl-2-pyrrolidone (NMP), methyl ethyl ketone (MEK), NN-dimethyl formamide (DMF), or water.

Subsequently, the mixed solution is cooled (S19). In the process, the polymer may be recrystallized to form a polymer matrix, a plurality of the quantum dots may be trapped in the polymer matrix, and then a microcapsular quantum dot-polymer composite may be formed. The quantum dots may be irregularly distributed and dispersed in the polymer matrix. Here, a polar functional group in the side chain of the polymer may increase a self-assembling rate of the polymer, and may also serve as a trap site trapping the quantum dots. In the process, the high-molecular-weight polymer may also be recrystallized or self-assembled to form the polymer matrix.

The temperature of the mixed solution after cooling may be room temperature. When the mixed solution is cooled, a cooling rate may be about 1 to about 200° C./min. Since a shape or size of the produced quantum dot-polymer composites may vary depending on the cooling rate or the concentration of the polymer in the polymer solution described above, and a stability of the quantum dot may vary depending on the shape, it may be necessary to properly control the cooling rate and the concentration of the polymer.

The operations described above may be performed using a continuous reactor. In the embodiment, the preparation of the polymer solution (S13) may be performed in a high temperature solution tank, the preparation of the mixed solution by adding the quantum dot suspension to the polymer solution (S17) may be performed in a mixing tank, the preparation of polymer-quantum dot composites by cooling the mixed solution (S19) may be performed in a cooling tank, recovery of the polymer-quantum dot composites may be performed in a recovery tank, and the high temperature solution tank, the mixing tank, the cooling tank, and the recovery tank may be interconnected to constitute the continuous reactor.

Figure 3A:
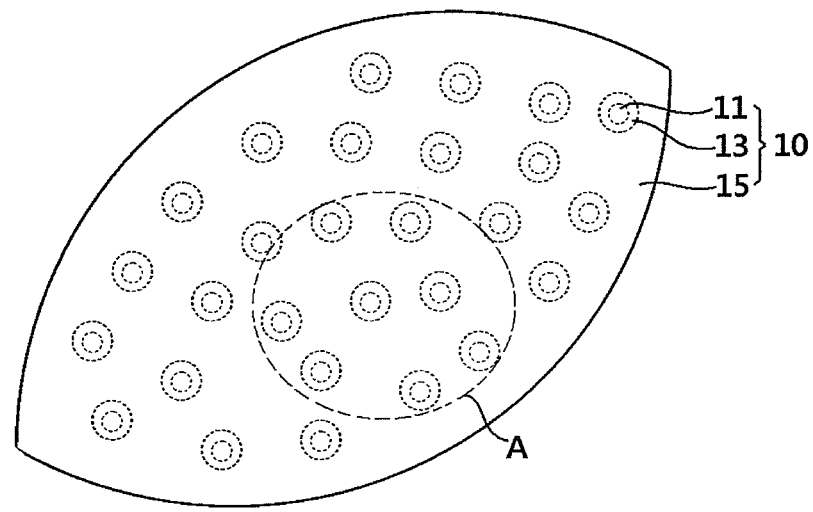
FIG. 3A is a schematic view illustrating a quantum dot-polymer composite microcapsule produced by the method described in reference to FIG. 2.
Figure 3B:
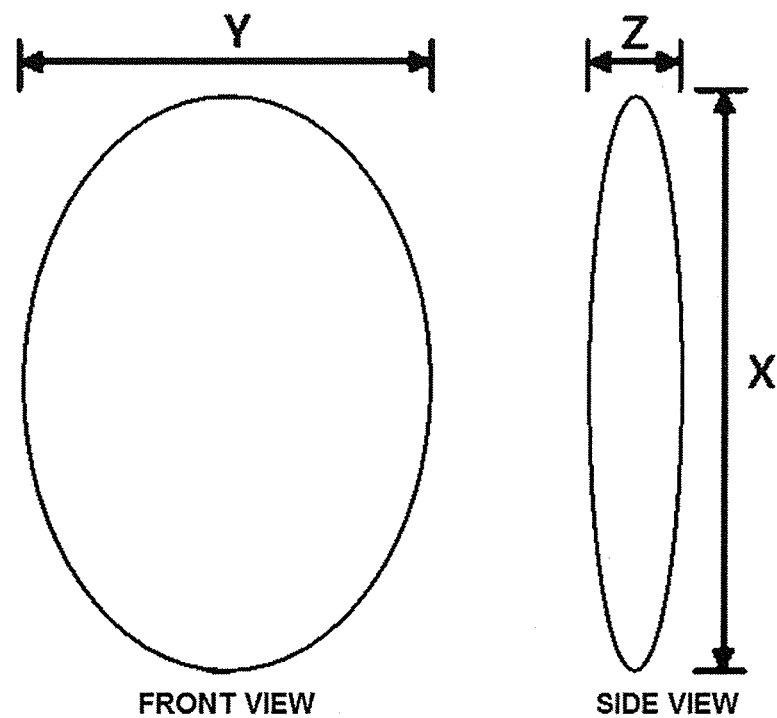
FIG. 3B shows front and side views schematically illustrating the polymer microparticle of FIG. 3A.

FIG. 3A is a schematic view illustrating a quantum dot-polymer composite microcapsule produced by the method described in reference to FIG. 2. FIG. 3B shows front and side views illustrating the polymer microparticles of FIG. 3A.

Referring to FIGS. 3A and 3B, a microcapsular quantum dot-polymer composite 10 may include a polymer matrix 15 and quantum dots 11 dispersed and positioned in the polymer matrix 15. A capping layer 13 may be disposed at an exterior of the quantum dot 11, in other words, disposed to surround each quantum dot 11 between the quantum dot 11 and the polymer matrix 15.

The polymer matrix 15 may include a polymer having a polar functional group in a side chain, may also include a high-molecular-weight polymer having a higher average molecular weight than the polymer having a polar functional group in the side chain when the high-molecular-weight polymer is added, and the polar functional group in the side chain of the polymer may serve as a trap site trapping the quantum dots 11. Accordingly, the quantum dots 11 may be positioned stably in the polymer matrix 15. Thus, an acid value of the polymer having a polar functional group in the side chain may be in a range of about 1 to about 100 mgKOH/g. On the other hand, the polar functional group may work as a defect with respect to the polymer matrix. This defect may degrade humidity resistance of the polymer matrix 15. Therefore, an acid value of the polymer having a polar functional group in the side chain may be about 40 mgKOH/g or less, for example, about 30 mgKOH/g or less. Specifically, an acid value of the polymer having a polar functional group in the side chain may be in a range of about 3 to about 40 mgKOH/g, more specifically, in a range of about 3 to about 30 mgKOH/g.

Further, when the polymer having a polar functional group in the side chain (when the high-molecular-weight polymer is included, the high-molecular-weight polymer also) is a crystalline polymer, the microcapsular quantum dot-polymer composite 10 may have a specific shape. When the main chain of the polymer having a polar functional group in the side chain is a polyolefin, for example, the polymer is a partially oxidized polyolefin, especially, a partially oxidized polyolefin wax, and the high-molecular-weight polymer, when the high-molecular-weight polymer is also included, is a polyolefin, the microcapsule, in other words, the microcapsular quantum dot-polymer composite 10 may be in a shape of an ellipsoidal solid, or in a shape similar to an almond. Here, a length (x) of a direction of a major axis (i.e., a direction of an X-axis) of the capsule may be in a range of several to tens of micrometers, for example, 1 to 20 μm, and a length (y) of a direction of minor axis (i.e., a direction of a Y-axis) may be in a range of several to tens of micrometers, for example, 1 to 10 μm, and a thickness (i.e., a direction of a Z-axis) may be in a range of tens of nanometers to several micrometers, for example, 100 nm to 2 μm.

When the polymer having a polar functional group in the side chain is a non-polar polymer, for example, a main chain thereof is a polyolefin, specifically, the polymer having a polar functional group in the side chain is a polyolefin wax, the polymer matrix 15 may have low moisture content characteristics or excellent moisture barrier properties due to non-polarity, and thus, damage to the quantum dots 11 may be prevented. Consequently, the quantum dot-polymer composite 10 may maintain excellent quantum efficiency for a long term.

Further, when the high-molecular-weight polymer is included, since the high-molecular-weight polymer has a higher average molecular weight than the polymer having a polar functional group in the side chain, a melt viscosity of the polymer matrix 15 may be enhanced. In this case, it is determined that a denaturalization of the quantum dot 11 due to heat may be suppressed. That is, when the quantum dot-polymer composite 10 is subject to a high temperature environment of hundreds of degrees, such as heat generated upon operation of a light emitting diode, the polymer matrix 15 may melt, however a degree of flow may be decreased upon melting by adding the high-molecular-weight polymer. In this case, a form stability of the quantum dot-polymer composite 10 may be increased, and thus, the quantum dot 11 may not be exposed to the outside, and accordingly, heat transfer to the quantum dot 11 may remain blocked. Accordingly, by suppressing the damage to the quantum dot 11 due to heat, thermal resistance or thermal stability of the quantum dot-polymer composite 10 may be improved. However, the present invention is not limited to this theory. As described above, when the polymer additionally includes a crosslinkable substituent, the polymer matrix 15 may pass through a curing process, and the crosslinkable substituent may be cured during the curing process, and thus moisture barrier properties and thermal resistance are further improved, thereby more effectively preventing damage to the quantum dot 11.

Figure 3C:
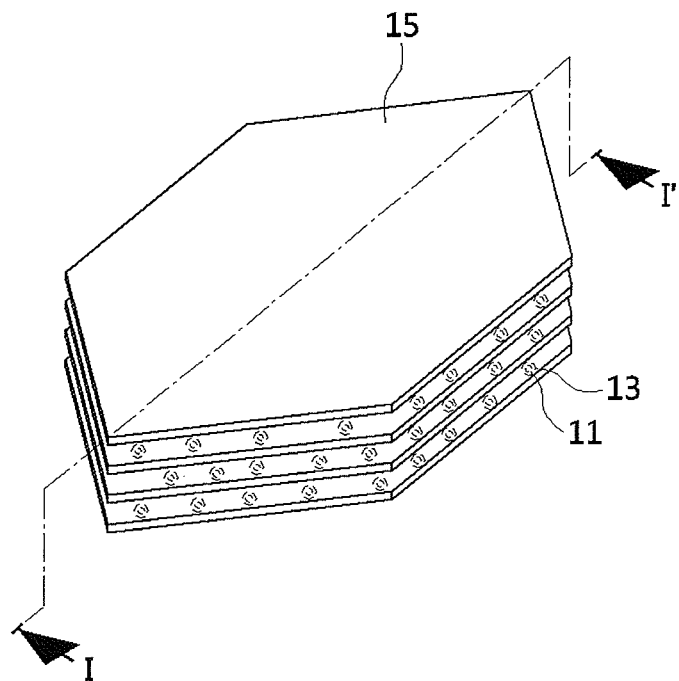
FIG. 3C is an enlarged perspective view illustrating a portion A of FIG. 3A.
Figure 3D:
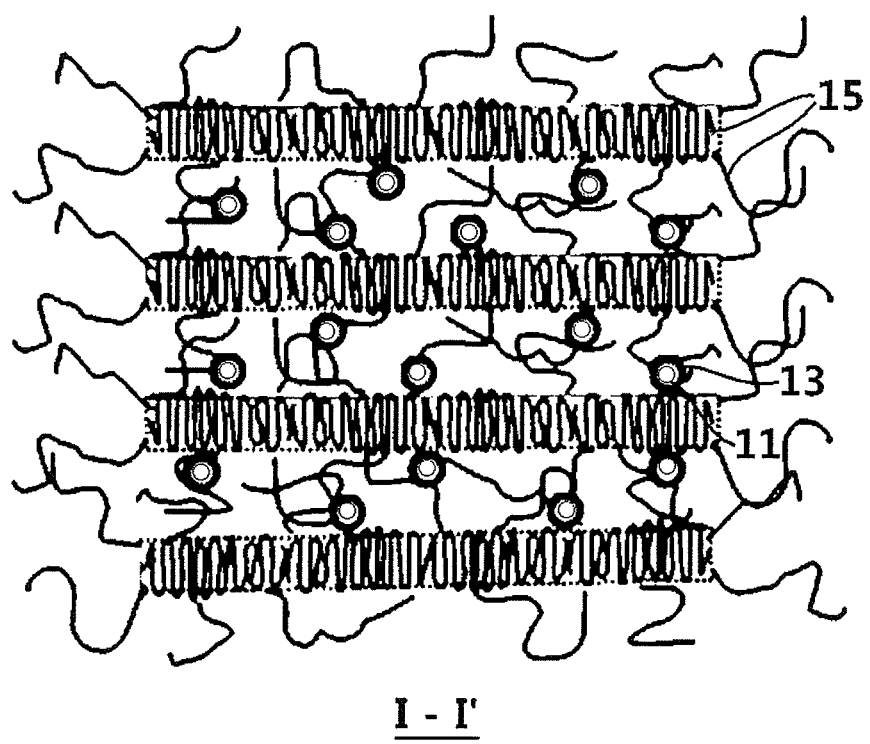
FIG. 3D is a cross-sectional view taken along line I-I' of FIG. 3C.

FIG. 3C is an enlarged perspective view illustrating a portion A of FIG. 3A, and FIG. 3D is a cross-sectional view taken along line I-I' of FIG. 3C.

Referring to FIG. 3C and FIG. 3D, a position relation of the polymer matrix 15 and the quantum dots 11 in the microcapsular quantum dot-polymer composite described in reference to FIG. 3A may be explained. However, the position relation is predicted experimentally, and is not limited thereto.

The polymer matrix 15 may include a plurality of sequentially laminated crystalline plates and amorphous polymers disposed between the plates. In the embodiment, a main chain of the polymer matrix 15 is a polyolefin, especially, a polyethylene, and the polymer matrix 15 may include a plurality of sequentially laminated hexagonal plates. A plurality of the laminated plates may be present in one microcapsular quantum dot-polymer composite 10, and each plate may be laminated in different directions.

The quantum dots 11 may be positioned between a plurality of the crystalline plates of the polymer matrix 15. A capping layer 13 may be disposed at an exterior of the quantum dot 11, in other words, disposed to surround the quantum dot 11 between the quantum dot 11 and the polymer matrix 15.

Further, polymer microparticles produced using the method described in reference to FIG. 1 may have the same shape and structure with particles except for the quantum dots 11 capped by the capping layer 13 in FIGS. 3A, 3B, 3C, and 3D.

Figure 4:
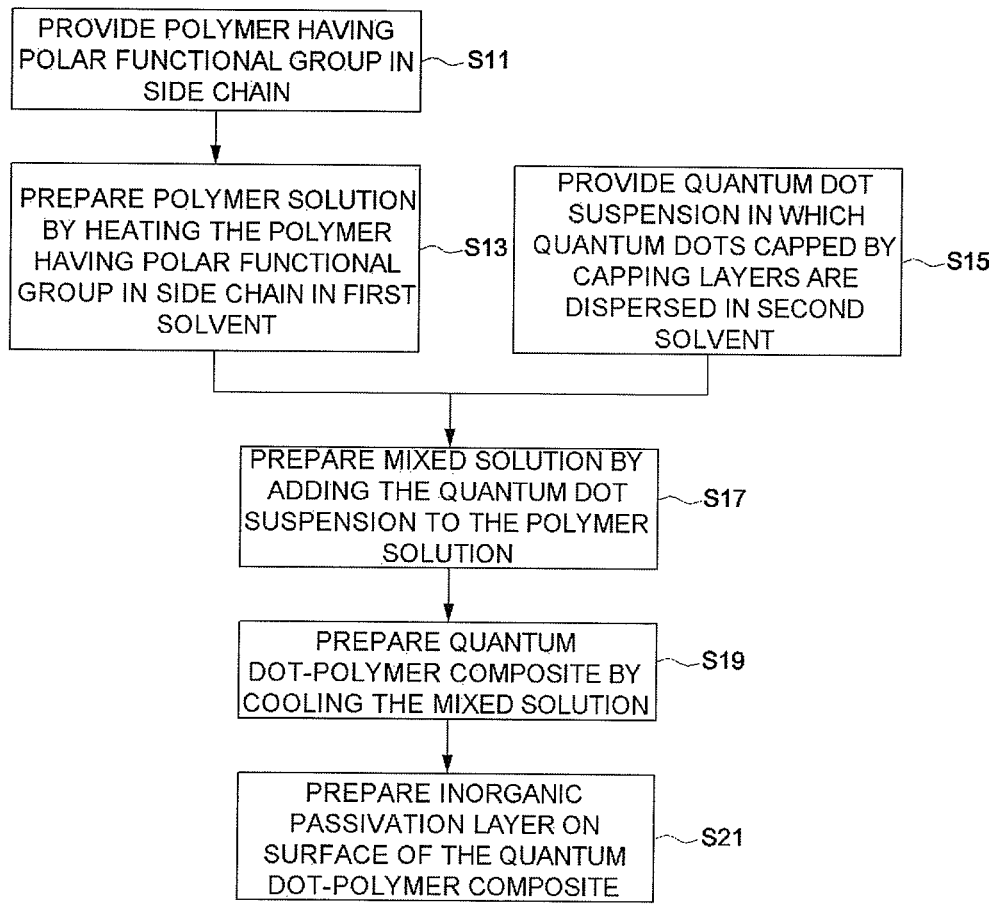
FIG. 4 is a flow chart illustrating a method of producing quantum dot-polymer composites according to another exemplary embodiment of the present invention.
Figure 5:
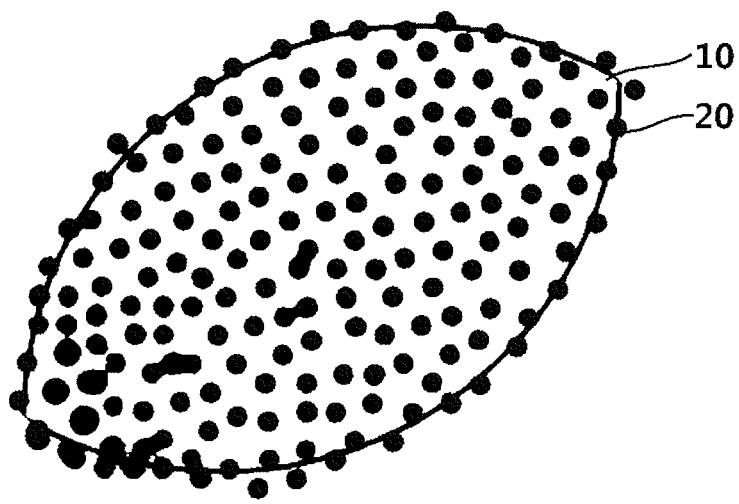
FIG. 5 is a schematic view illustrating a quantum dot-polymer composite produced by a method described in reference to FIG. 4.

FIG. 4 is a flow chart illustrating a method of producing a quantum dot-polymer composite according to another exemplary embodiment of the present invention. FIG. 5 is a schematic view illustrating a quantum dot-polymer composite produced by the method described in reference to FIG. 4.

Referring to FIGS. 4 and 5, a passivation layer of an inorganic material 20 may be formed on a surface of the quantum dot-polymer composite obtained through the process as in FIG. 2 (S11, S13, S15, S17, S19), in other words, on a surface of the polymer matrix (S21). The inorganic material 20 may be inorganic particles. The inorganic particles may be titanium oxide, silicon oxide, aluminum oxide, graphene, graphene oxide, or carbon nanotubes. At least two types of the above inorganic particles may be positioned on the surface of the quantum dot-polymer composite. In this case, double layers of inorganic passivation layers 20 may be formed. In the embodiment, after a silicon oxide layer is disposed on the surface of the quantum dot-polymer composite, a titanium oxide layer may be further disposed on the silicon oxide layer.

A portion of the inorganic particles, for example, titanium oxide, silicon oxide, and aluminum oxide may be formed by a sol-gel method. Further, when the surface of the quantum dot-polymer composite, in other words, a polymer forming the polymer matrix has a certain acid value, for example, of 1 to 100 mgKOH/g, specifically, of 3 to 40 mgKOH/g, an adherence rate of the inorganic particles on the surface of the quantum dot-polymer composite may be improved. The inorganic material 20 may enhance thermal stability or humidity resistance of the microcapsule, and may function as a shield layer from other pollutants. Further, the inorganic material 20 may inhibit aggregation of the quantum dot-polymer composites 10. Therefore, the quantum dot-polymer composite passivated by the inorganic material 20 may be manufactured as a product in the form of a powder.

In another embodiment of the present invention, a surface of a polymer microparticle produced using the method described in reference to FIG. 1 may be passivated by the inorganic material 20.

Figure 6A:
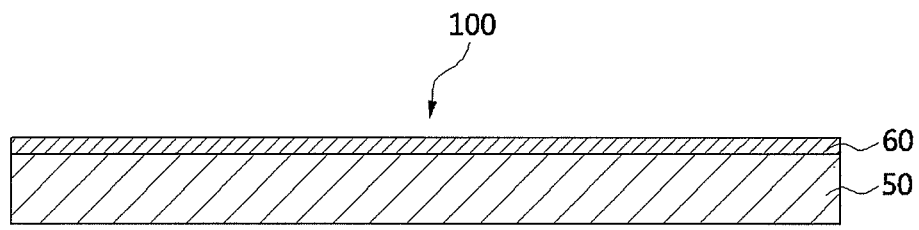
FIG. 6A is a cross-sectional view illustrating an optical device according to another exemplary embodiment of the present invention.
Figure 6B:
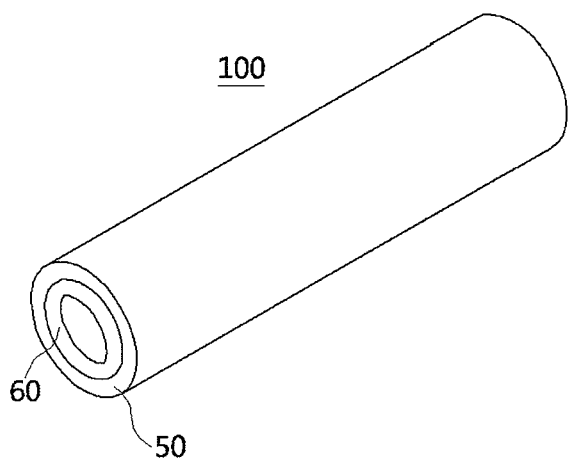
FIG. 6B is a perspective view illustrating an optical device according to another exemplary embodiment of the present invention.

FIG. 6A is a cross-sectional view illustrating an optical device according to another exemplary embodiment of the present invention. FIG. 6B is a perspective view illustrating an optical device according to another exemplary embodiment of the present invention.

Referring to FIG. 6A and FIG. 6B, a base substrate 50 may be provided. The base substrate 50 may have a plate shape (FIG. 6A) or a tube shape (FIG. 6B). The base substrate 50 may be, as a light transmitting substrate, a glass or a polymer film. The polymer film may be a polyimide film or a polyethylene terephthalate film.

A suspension in which the microcapsular quantum dot-polymer composites described in reference to FIG. 2 or FIG. 4 are dispersed may be provided on the base substrate 50. The solvent in the suspension may be toluene or ethanol. Providing the suspension on one surface of the base substrate may denote coating the suspension on an upper surface of the base substrate. For example, when the base substrate 50 is a plate-type substrate (FIG. 6A), coating the suspension on an upper surface of the base substrate may be performed through a wet coating, for example, a spray coating or a bar coating. On the other hand, when the base substrate 50 is a tube-type substrate (FIG. 6B), providing the suspension on one surface of the base substrate may denote coating the suspension on an inner surface of the base substrate 50 using a capillary phenomenon.

Thereafter, the solvent may be removed to form an optical conversion layer 60. The optical conversion layer 60 is a layer having the quantum dot-polymer composites, and the quantum dot-polymer composites may be present dispersed and positioned in forms of particles in the optical conversion layer 60. The formation of the optical conversion layer 60 may further include coating the suspension, and then curing the coated suspension.

The optical device 100 may be disposed on a separate light source, and the quantum dot-polymer composites in the optical conversion layer 60 may convert light emitted from the light source to a light in a desired wavelength range.

Figure 7:
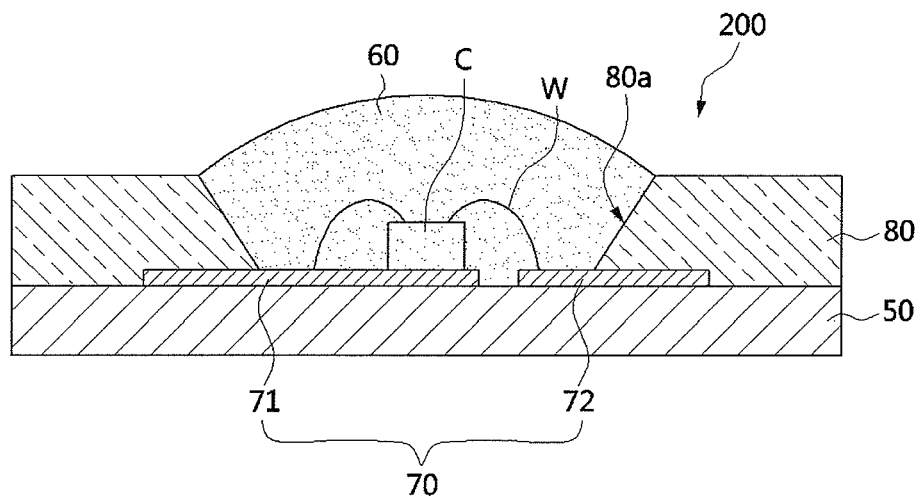
FIG. 7 is a cross-sectional view illustrating an optical device according to another exemplary embodiment of the present invention.

FIG. 7 is a cross-sectional view illustrating an optical device according to another exemplary embodiment of the present invention.

Referring to FIG. 7, a base substrate 50 which includes a device area and a peripheral area surrounding the device area is provided. The base substrate 50 may be a silicon substrate, a metal substrate, a ceramic substrate, or a resin substrate. The device area may be an area on which a light emitting diode semiconductor chip is mounted, and the peripheral area may be an area other than the device area.

The base substrate 50 may include bonding pads 71 and 72 on the device area thereof. A housing 80 having a cavity 80a may be disposed on the peripheral area of the base substrate 50. A portion of the bonding pads 71 and 72 may be exposed in the cavity 80a. The housing 80 may be formed of silicon, a metal, a ceramic or a resin. The base substrate 50 and the housing 80 may be an integral type which is not separated.

A light emitting diode chip C is positioned at one of the bonding pads 71 exposed in the cavity 80a. The light emitting diode chip C has an N-type semiconductor layer, a P-type semiconductor layer, and an active layer interposed there between. When an electric field is applied between the N-type semiconductor layer and the P-type semiconductor layer, electrons and holes are recombined, and then the light emitting diode chip C emits light. The light emitting diode chip C may be one of a GaAlAs-, AlGaIn-, AlGaInP-, AlGaInPAs-, or GaN-light emitting diode chip. The light emitting diode chip C may be a device emitting visible light, ultraviolet light, or infrared light. An N-type electrode and a P-type electrode of the light emitting diode chip C may be electrically connected to the bonding pads 71 and 72 through wires W, respectively.

Further, a suspension in which the microcapsular quantum dot-polymer composites are dispersed and which is described in reference to FIG. 2 or FIG. 4 may be provided. A coating solution may be prepared by mixing the suspension and the sealing resin (solution). The sealing resin may be a curable resin. In the embodiment, the sealing resin may be selected from the group consisting of epoxy resins, phenol resins, polyesters, silicone resins, acrylate resins, urethane-acrylate resins and combinations thereof. A phosphor may be further included in the coating solution.

An optical conversion layer 60 may be formed by dotting the coating solution on the light emitting diode chip C. The formation of the optical conversion layer 60 may further include curing the dotted coating solution after dotting the coating solution. When the polymer (matrix) in the quantum dot-polymer composites has a crosslinkable substituent, the polymer (matrix) may also be cured simultaneously with the curable resin in the process of curing the mixed solution. The curable resin may contain a curing agent which may flow into the quantum dot-polymer composite and cure the polymer (matrix). Dotting of the mixed solution may be performed using a printing method or a dispensing method.

The optical conversion layer 60 may enable the device to show appropriate colors by converting light emitted from the light emitting diode chip C to light of a lower wavelength. In the embodiment, when the light emitting diode chip C is a device generating ultraviolet rays, a white light-emitting device may be embodied by the optical conversion layer 60 in which red quantum dots, green quantum dots, and blue quantum dots are provided. When the light emitting diode is a device generating blue light, a white light-emitting device may be embodied by the optical conversion layer 60 in which yellow quantum dots are provided.

Otherwise, when the light emitting diode is a device generating blue light, a white light-emitting device may be embodied by the optical conversion layer 60 in which yellow inorganic phosphors and red quantum dots are provided. In this case, a warm white color suitable for illuminating may be embodied. Here, using quantum dots as an optical converter for red may be more cost effective than using red phosphors, and excellent optical conversion efficiency of the quantum dots may also decrease the amount used in the device as compared to a case in which phosphors are used.

When the quantum dot-polymer composite is prepared, the quantum dot-polymer composite may be produced so that a plurality kinds of the quantum dots capable of converting light to light of different colors may be included in one quantum dot-polymer composite. On the other hand, several types of quantum dot-polymer composites each having quantum dots of different kinds and capable of converting light to light of different colors may be mixed in the mixed solution.

Figure 8A:
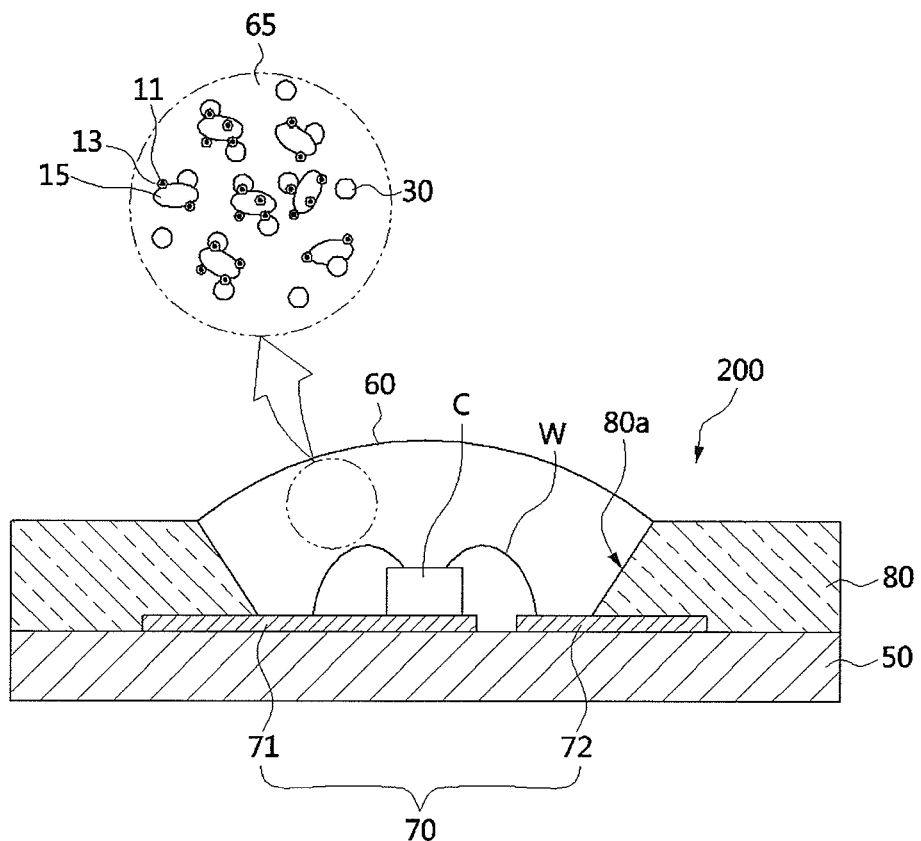
FIG. 8A is a cross-sectional view illustrating an optical device according to another exemplary embodiment of the present invention.

FIG. 8A is a cross-sectional view illustrating an optical device according to another exemplary embodiment of the present invention. The optical device according to the embodiment is similar to the optical device described in reference to FIG. 7 except for the following descriptions.

Referring to FIG. 8A, a base substrate 50 which has a device area and a peripheral area surrounding the device area is provided. The base substrate 50 may include bonding pads 71 and 72 on the device area thereof. A housing 80 having a cavity 80a may be disposed on the peripheral area of the base substrate 50. A light emitting diode chip C is positioned at one of the bonding pads 71 exposed in the cavity 80a.

Further, a suspension in which polymer microparticles 15, which is described in reference to FIG. 1, and quantum dots 11 capped by capping layers 13 are dispersed may be provided. A surface of the polymer microparticles 15 may be coated with an inorganic material described in reference to FIG. 5. Phosphors 30 may be further dispersed in the suspension.

The solvent in the suspension may be toluene or ethanol. A coating solution may be prepared by mixing the suspension with a sealing resin 65 (solution). The sealing resin 65 may be a curable resin. In the embodiment, the sealing resin 65 may be selected from the group consisting of epoxy resins, phenol resins, polyesters, silicone resins, acrylate resins, urethane-acrylate resins and combinations thereof. The sealing resin 65 may be a silicone resin having a low possibility of yellowing.

An optical conversion layer 60 may be formed by dotting the coating solution on the light emitting diode chip C.

Polar functional groups may be exposed on the surface of the polymer microparticles 15 due to polymers having polar functional groups in side chains contained in the polymer microparticles 15. Due to the polar functional groups, the quantum dots 11 capped by the capping layer 13 and the phosphors 30 may be adhered to surfaces of the polymer microparticles 15. The polymer microparticles 15 may be dispersed well in the optical conversion layer 60. As a result, the quantum dots 11 adhered to the surfaces of the polymer microparticles 15 may also be dispersed well. For descriptions regarding the quantum dots 11 and the capping layer 13, the described in FIG. 2 may be referred to.

The formation of the optical conversion layer 60 may further include curing the dotted coating solution after dotting the coating solution. When the polymer (matrix) in the polymer microparticle 15 has a crosslinkable substituent, in the process of curing the mixed solution, the sealing resin 65 may be cured, and simultaneously, the polymer (matrix) may also be cured. The sealing resin 65 may contain a curing agent, which may flow into the polymer microparticles 15 and cure the polymer (matrix). Dotting of the mixed solution may be performed using a printing method or a dispensing method.

The polymer microparticles 15, the quantum dots 11 capped by the capping layers 13, and the phosphors 30 may be dispersed and positioned in the optical conversion layer 60. However, as described above, the quantum dots 11 capped by the capping layers 13 and the phosphors 30 may be adhered to the surfaces of the polymer microparticles 15. Accordingly, as described above, dispersibility of the quantum dots 11 in the optical conversion layer 60 may also be excellent. Since the polymer microparticle 15 has low moisture content characteristics or excellent moisture barrier properties due to non-polarity, the quantum dots 11 adhered to the polymer microparticles 15 may be protected from high temperature and high humidity conditions. Further, since a shape of the polymer microparticle 15 is a relatively flat ellipsoidal solid as described in FIGS. 2A and 2B, the polymer microparticle 15 may have large surface area compared to the mass of the polymer microparticle 15. As a result, the number of the quantum dots 11 adhered to the polymer microparticles 15 may be increased, and humidity resistance of the optical conversion layer 60 may be increased due to the polymer microparticles 15. Further, when high-molecular-weight polymers are included in the polymer microparticles 15, thermal resistance or thermal stability of the polymer microparticles 15 may be improved, and therefore, thermal resistance or thermal stability of the quantum dots 11 adhered thereto may also be increased.

The optical conversion layer 60 may embody a device showing appropriate colors by converting light emitted from the light emitting diode chip C to light of a lower wavelength. In the embodiment, when the light emitting diode chip C is a device generating blue light, a white light-emitting device may be embodied by the optical conversion layer 60 in which yellow or green inorganic phosphors and red quantum dots are provided. In this case, a warm white color suitable for illuminating may be embodied. Here, using quantum dots as an optical converter for red may be more cost effective than using red phosphors, and excellent optical conversion efficiency of the quantum dots may also decrease the amount used as compared to a case in which phosphors are used.

Figure 8B:
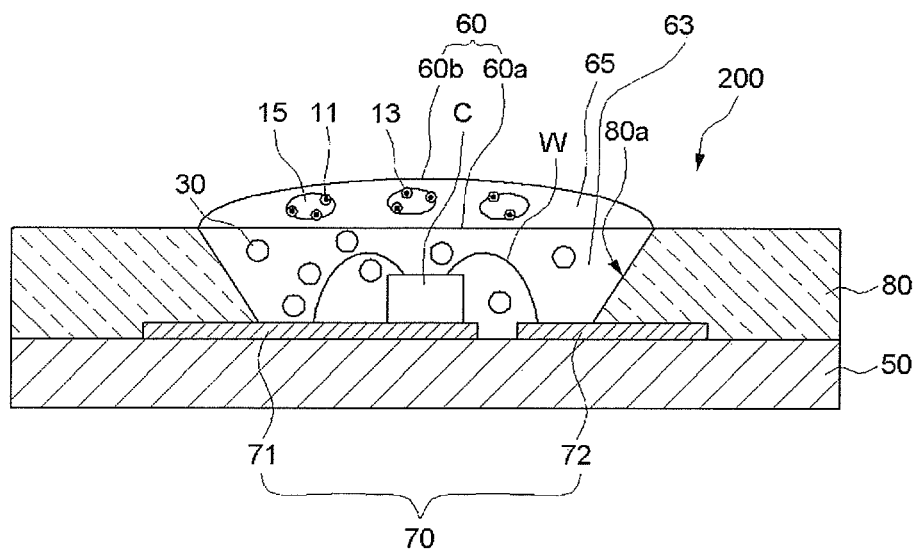
FIGS. 8B and 8C are cross-sectional views illustrating optical devices according to other exemplary embodiments of the present invention.
Figure 8C:
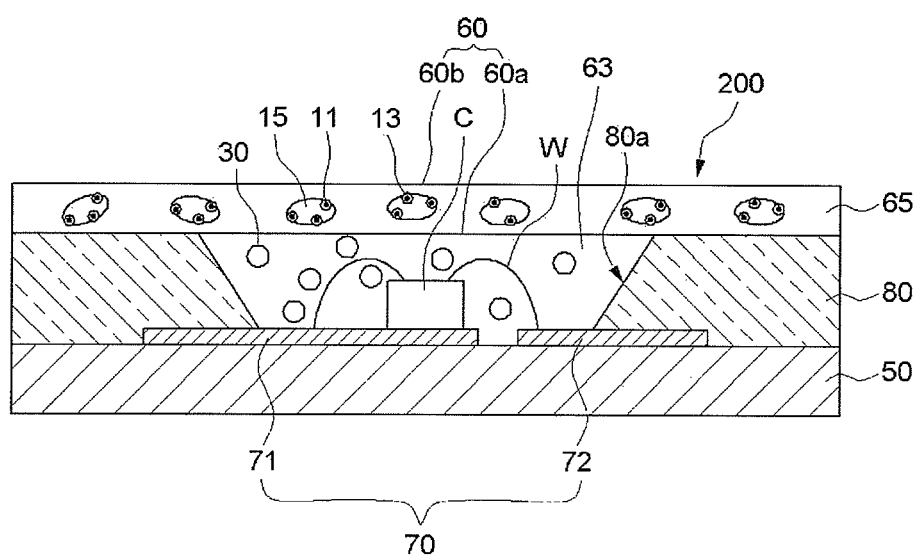

FIGS. 8B and 8C are cross-sectional views illustrating optical devices according to another exemplary embodiment of the present invention. The optical devices according to the embodiment are similar to the optical device described in reference to FIG. 8A except for the following descriptions.

Referring to FIG. 8B and FIG. 8C, a phosphor optical conversion layer 60a in which phosphors 30 are dispersed and a first sealing resin 63 is included may be formed on the light emitting diode chip C. Thereafter, a quantum dot optical conversion layer 60b, in which the polymer microparticles 15 and the quantum dots 11 capped by the capping layers 13 are dispersed and a sealing resin 65 is included, may be formed on the phosphor optical conversion layer 60a. The phosphor optical conversion layer 60a and the quantum dot optical conversion layer 60b constitute an optical conversion layer 60.

The quantum dot optical conversion layer 60b may be formed by dotting a coating solution (FIG. 8B), or may be formed in a separate film shape (FIG. 8C) on the phosphor optical conversion layer 60a.

Figure 9A:
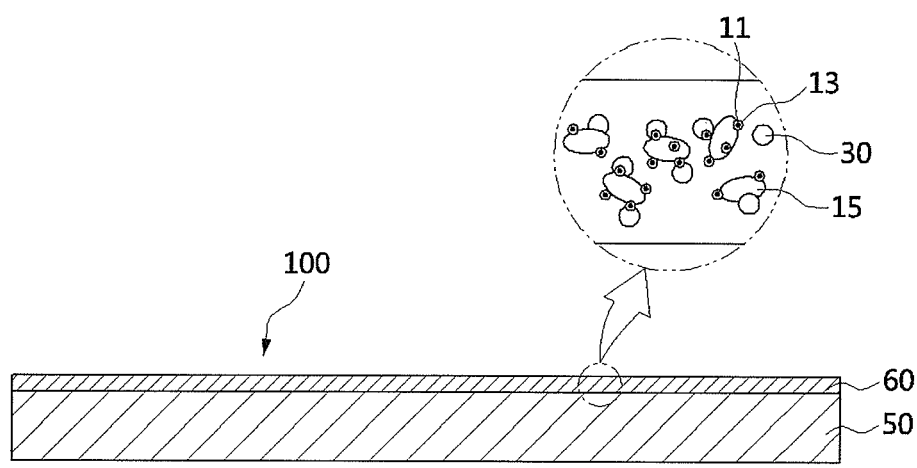
FIG. 9A is a cross-sectional view illustrating an optical device according to another exemplary embodiment of the present invention.

FIG. 9A is a cross-sectional view illustrating an optical device according to another exemplary embodiment of the present invention. The optical device according to the embodiment is similar to the optical device described in reference to FIGS. 6A and 6B except for the following descriptions.

Figure 9B:
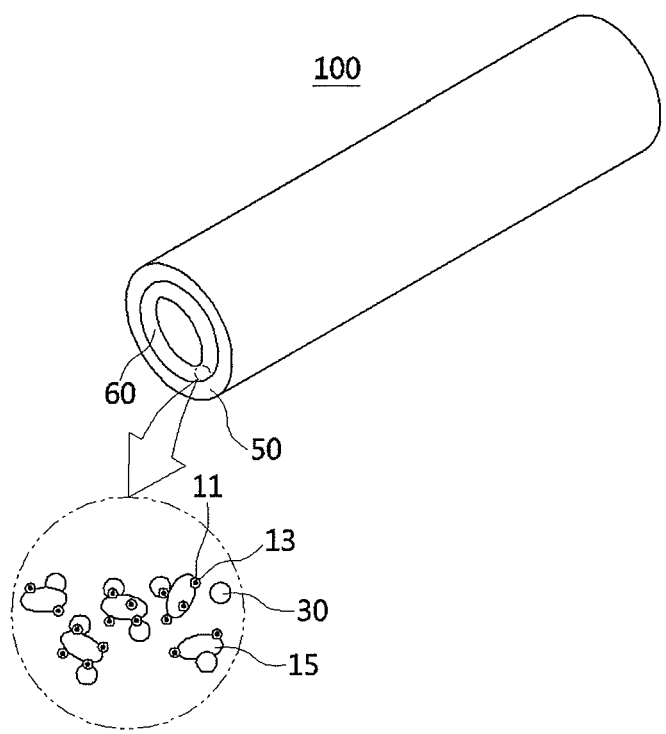
FIG. 9B is a perspective view illustrating an optical device according to another exemplary embodiment of the present invention.

Referring to FIGS. 9A and 9B, a suspension in which polymer microparticles 15, which is described in reference to FIG. 1, and quantum dots 11 capped by capping layers 13 are dispersed may be provided on a base substrate 50. A surface of the polymer microparticle 15 may be coated with an inorganic material described in reference to FIG. 5. Phosphors 30 may be further dispersed in the suspension. A solvent in the suspension may be toluene or ethanol.

Providing the suspension may denote coating the suspension on one surface of the base substrate 50. For example, when the base substrate 50 is a plate-type substrate (FIG. 9A), coating the suspension on an upper surface of the base substrate may be performed through wet coating such as spray coating or bar coating. On the other hand, when the base substrate 50 is a tube-type substrate (FIG. 9B), providing the suspension on one surface of the base substrate may denote coating the suspension on an inner surface of the base substrate 50 using a capillary phenomenon.

Thereafter, the solvent may be removed to form an optical conversion layer 60. The formation of the optical conversion layer 60 may further include curing the coated suspension after coating the suspension.

The polymer microparticles 15, the quantum dots 11 capped by the capping layers 13, and the phosphors 30 may be dispersed and positioned in the optical conversion layer 60. However, as described above, the quantum dots 11 capped by the capping layers 13 and the phosphors 30 may be adhered to the surfaces of the polymer microparticles 15.

The optical device 100 may be disposed on a separate light source, and the quantum dots 11 and the phosphors 30 in the optical conversion layer 60 may convert light emitted from the light source to light in a desired wavelength range. In the embodiment, when the light source is a blue light source, the phosphors 30 may be yellow or green phosphors, and the quantum dots 11 may be red quantum dots.

Hereinafter, exemplary embodiments will be proposed to facilitate understanding of the present invention. However, the following experimental examples are merely for ease of explanation, and the present invention is not limited the following experimental examples.

EXPERIMENTAL EXAMPLES

Examples

Comparative Example 1

Fabrication of Optical Film

A curable resin solution in which 0.75 g of MEK was added to 3 g of an epoxy diacrylate oligomer was prepared and heated to 90° C. CdSe/ZnS core-shell quantum dots including hexadecyl amine as a capping layer were dispersed in toluene at a concentration of 20 mg/ml to prepare a quantum dot suspension. After 0.3 ml of the quantum dot suspension and the curable resin solution were mixed, 60 mg of a UV curing initiator (irgacure 184) was added to the mixed solution, and then a coating solution was prepared. The coating solution was maintained at 45° C., and then the coating solution was applied on an optical PET film with a thickness of 140 µm to have a thickness of 10 µm using a bar coater. Thereafter, a coating layer was cured using a UV irradiator.

Comparative Example 2

Fabrication of Light Emitting Diode

CdSe/ZnS core-shell quantum dots including hexadecyl amine as a capping layer were dispersed in toluene at a concentration of 20 mg/ml to prepare a quantum dot suspension. After 0.3 ml of the quantum dot suspension and 1 g of a silicone resin were mixed, the solvent was completely removed using a decompression rotary evaporator. The suspension from which the solvent was removed was injected onto a blue light emitting diode, and then cured at 100° C. for 10 hours.

Example 1

Preparation of Polymer Microparticles 5 g of toluene was added to a 20 ml-glass bottle, and then 50 mg of a partially oxidized polyethylene wax having an acid value of about 17 mgKOH/g was further added to the glass bottle, and the mixed solution was stirred with heating at 100 to 110° C. until the solution became transparent, and then a polymer solution was prepared. Thereafter, the heating device was removed, and the polymer solution was cooled down to room temperature.

Example 2

Preparation of Polymer Microparticles

After the polymer solution cooled down to room temperature in Example 1, was centrifuged, a supernatant liquid was removed, and then a precipitate was obtained. Thereafter, 3 ml of ethanol was added to the precipitate and mixed. Here, 0.3 ml of tetraethyl orthosilicate (TEOS) and 0.2 ml of an ammonia solution were sequentially added, and stirred for 5 hours. Subsequently, a supernatant liquid was removed, and a precipitate was washed with ethanol once. The obtained precipitate was dried in a hot air oven at 70° C. for 24 hours.

Example 3

Preparation of Quantum Dot-Polymer Composite 5 g of toluene was added to a 20 ml-glass bottle, 50 mg of a partially oxidized polyethylene wax having an acid value of about 17 mgKOH/g was further added to the glass bottle, the mixed solution was stirred with heating at 100 to 110° C. until the solution became transparent, and then a polymer solution was prepared. CdSe/ZnS core-shell quantum dots including hexadecyl amine as a capping layer were dispersed in toluene at a concentration of 20 mg/ml to prepare a quantum dot suspension. After 0.3 ml of the quantum dot suspension was added to 0.75 g of the polymer solution having a temperature of 100 to 110° C., a mixed solution was prepared, and then the mixed solution was cooled down to room temperature.

Example 4

Preparation of Quantum Dot-Polymer Composite 5 g of toluene was added to a 20 ml-glass bottle, 50 mg of a partially oxidized polyethylene wax having an acid value of about 3 mgKOH/g was further added to the glass bottle, the mixed solution was stirred with heating at 100 to 110° C. until the solution became transparent, and then a polymer solution was prepared. CdSe/ZnS core-shell quantum dots including hexadecyl amine as a capping layer were dispersed in toluene at a concentration of 20 mg/ml to prepare a quantum dot suspension. After 0.3 ml of the quantum dot suspension was added to 0.75 g of the polymer solution having a temperature of 100 to 110° C., a mixed solution was prepared, and then the mixed solution was cooled down to room temperature.

Example 5

Fabrication of Optical Film 0.75 g of the mixed solution cooled down to room temperature in Example 3 was mixed with 3 g of an epoxy diacrylate oligomer, and then a coating solution was prepared. Subsequently, 60 mg of a UV curing initiator (irgacure 184) was mixed well in the coating solution, and then the coating solution was applied on an optical PET film with a thickness of 140 μm to have a thickness of 10 μm using a bar coater. Thereafter, a coating layer was cured using a UV irradiator.

Example 6

Fabrication of Light Emitting Diode

After 0.75 g of the mixed solution cooled down to room temperature in Example 3 and 1 g of a silicone resin were mixed, the solvent was completely removed using a decompression rotary evaporator. 15 mg of the mixed solution from which the solvent was removed was injected onto a blue light emitting diode, and cured at 100° C. for 10 hours.

Example 7

Fabrication of Light Emitting Diode

After 0.75 g of the mixed solution cooled down to room temperature in Example 4 and 1 g of a silicone resin were mixed, the solvent was completely removed using a decompression rotary evaporator. 15 mg of the mixed solution in which the solvent was removed was injected onto a blue light emitting diode, and cured at 100° C. for 10 hours.

Example 8

Preparation of Polymer Microparticles 5 g of toluene was added to a 20 ml-glass bottle, 50 mg of a partially oxidized polypropylene wax having an acid value of about 37 mgKOH/g was further added to the glass bottle, the mixed solution was stirred with heating at 100 to 110° C. until the solution became transparent, and then the polymer solution was prepared. Thereafter, a heating device was removed, and the polymer solution was cooled down to room temperature.

Example 9

Fabrication of Light Emitting Diode 5 g of toluene was added to a 20 ml-glass bottle, 50 mg of a partially oxidized polypropylene wax having an acid value of about 37 mgKOH/g was further added to the glass bottle, the mixed solution was stirred with heating at 100 to 110° C. until the solution became transparent, and then a polymer solution was prepared. CdSe/ZnS core-shell quantum dots including hexadecyl amine as a capping layer were dispersed in toluene at a concentration of 20 mg/ml to prepare a quantum dot suspension. After 0.3 ml of the quantum dot suspension was added to 0.75 g of the polymer solution having a temperature of 100 to 110° C., a mixed solution was prepared, and then the mixed solution was cooled down to room temperature. After 0.75 g of the cooled down mixed solution and 1 g of a silicone resin were mixed, the solvent was completely removed at room temperature using a decompression rotary evaporator. 15 mg of the mixed solution from which the solvent was removed was injected onto a blue light emitting diode, and cured at 100° C. for 10 hours.

Example 10

Preparation of Polymer Microparticles 5 g of toluene was added to a 20 ml-glass bottle, a partially oxidized polyethylene wax having an acid value of about 17 mgKOH/g and an LDPE were further added to the glass bottle, the mixed solution was stirred with heating at 100 to 110° C. until the solution became transparent, and then a polymer solution was prepared. Here, the polymer solution was prepared such that a total weight of the partially oxidized polyethylene wax and the LDPE was 50 mg, and a weight ratio of the LDPE was 5 wt %, 10 wt %, or 20 wt % therein. Thereafter, the heating device was removed, and the polymer solution was cooled down to room temperature with slow stirring. The solvent was completely removed at room temperature using a decompression rotary evaporator, and then polymer microparticles were obtained.

Example 11

Preparation of Polymer Microparticles

Polymer microparticles were obtained in the same manner as in Example 10, except that an HDPE was used instead of the LDPE.

Example 12

Fabrication of Light Emitting Diode 5 g of toluene was added to a 20 ml-glass bottle, a partially oxidized polyethylene wax having an acid value of about 17 (mgKOH/g) and 5 mg of an LDPE were further added to the glass bottle, the mixed solution was stirred with heating at 100 to 110° C. until the solution became transparent, and then a polymer solution was prepared. CdSe/ZnS core-shell quantum dots including hexadecyl amine as a capping layer were dispersed in toluene at a concentration of 20 mg/ml to prepare a quantum dot suspension. After 0.15 ml of the quantum dot suspension was added to the polymer solution having a temperature of 100 to 110° C. and stirred, a mixed solution was prepared, and then the mixed solution was cooled down to room temperature. After 0.75 g of the mixed solution cooled down to room temperature and 1 g of a silicone resin were mixed, the solvent was completely removed at room temperature using a decompression rotary evaporator. 15 mg of the mixed solution from which the solvent was removed was injected onto a blue light emitting diode, and cured at 120° C. for 10 hours.

Example 13

Fabrication of Light Emitting Diode

A light emitting diode was fabricated in the same manner as in Example 12, except that an HDPE was used instead of the LDPE.

Example 14

Fabrication of Light Emitting Diode 5 g of toluene was added to a 20 ml-glass bottle, a partially oxidized polyethylene wax having an acid value of about 17 (mgKOH/g) and 5 mg of an LDPE were further added to the glass bottle, the mixed solution was stirred with heating at 100 to 110° C. until the solution became transparent, and then a polymer solution was prepared. Thereafter, the heating device was removed, and the polymer solution was cooled down to room temperature, and thereby a polymer microparticle suspension in which polymer microparticles were dispersed in toluene was obtained. Further, CdSe/ZnS core-shell quantum dots including hexadecyl amine as a capping layer are dispersed in toluene at a concentration of 20 mg/ml to prepare a quantum dot suspension. After 0.3 ml of the quantum dot suspension, 0.75 g of the polymer microparticle suspension, and 1 g of a silicone resin were mixed, a mixed solution was prepared, and then the solvent was removed therefrom at room temperature using a decompression rotary evaporator. 15 mg of the mixed solution from which the solvent was removed was injected onto a blue light emitting diode, and cured at 100° C. for 10 hours.

Example 15

Fabrication of Light Emitting Diode

A light emitting diode was fabricated in the same manner as in Example 14, except that a partially oxidized polyethylene wax having an acid value of about 3 mgKOH/g was used instead of the partially oxidized polyethylene wax having an acid value of about 17 mgKOH/g.

Example 16

Fabrication of Light Emitting Diode

A light emitting diode was fabricated in the same manner as in Example 14, except that a polyethylene wax having an acid value of about 0 mgKOH/g was used instead of the partially oxidized polyethylene wax having an acid value of about 17 mgKOH/g.

Conditions of each of Comparative Examples 1 to 2 and Experimental Examples 1 to 13 are summarized in the following Table 1.

TABLE 1

| | Quantum dot suspension | | Polymer solution | | Quantum dot, capping layer | Curable resin | Inorganic passivation |
|---|---|---|---|---|---|---|---|
| | Quantum dot, capping layer | Dispersion medium | Polymer (Acid value; unit: mgKOH/g) | Solvent | | | |
| Example 1 | — | — | Partially oxidized polyethylene wax (Acid value: 17) | Toluene | — | — | — |
| Example 2 | — | — | Partially oxidized polyethylene wax (Acid value: 17) | Toluene | — | — | Silicon oxide |
| Example 3 | CdSe/ZnS core-shell quantum dot, hexadecyl amine | Toluene | Partially oxidized polyethylene wax (Acid value: 17) | Toluene | — | — | — |
| Example 4 | CdSe/ZnS core-shell quantum dot, hexadecyl amine | Toluene | Partially oxidized polyethylene wax (Acid value: 3) | Toluene | — | — | — |
| Example 5 | CdSe/ZnS core-shell quantum dot, hexadecyl amine | Toluene | Partially oxidized polyethylene wax (Acid value 17) | Toluene | — | Epoxy diacrylate oligomer | — |
| Example 6 | CdSe/ZnS core-shell quantum dot, hexadecyl amine | Toluene | Partially oxidized polyethylene wax (Acid value: 17) | Toluene | — | Silicone resin | — |
| Example 7 | CdSe/ZnS core-shell quantum dot, hexadecyl amine | Toluene | Partially oxidized polyethylene wax (Acid value: 3) | Toluene | — | Silicone resin | — |
| Example 8 | — | — | Partially oxidized polypropylene wax (Acid value: 37) | Toluene | — | — | — |

TABLE 1-continued

|  | Quantum dot suspension | | Polymer solution | | Quantum dot, | | |
|---|---|---|---|---|---|---|---|
|  | Quantum dot, capping layer | Dispersion medium | Polymer (Acid value; unit: mgKOH/g) | Solvent | capping layer | Curable resin | Inorganic passivation |
| Example 9 | CdSe/ZnS core-shell quantum dot, hexadecyl amine | Toluene | Partially oxidized polypropylene wax (Acid value: 37) | Toluene | — | Silicone resin | — |
| Example 10 | — | — | Partially oxidized polyethylene wax (Acid value: 17) LDPE | Toluene | — | — | — |
| Example 11 | — | — | Partially oxidized polyethylene wax (Acid value: 17) HDPE | Toluene | — | — | — |
| Example 12 | CdSe/ZnS core-shell quantum dot, hexadecyl amine | Toluene | Partially oxidized polyethylene wax (Acid value: 17) LDPE | Toluene | — | Silicone resin | — |
| Example 13 | CdSe/ZnS core-shell quantum dot, hexadecyl amine | Toluene | Partially oxidized polyethylene wax (Acid value: 17) HDPE | Toluene | — | Silicone resin | — |
| Example 14 | — | — | Partially oxidized polyethylene wax (Acid value: 17) | Toluene | CdSe/ZnS core-shell quantum dot, hexadecyl amine | Silicone resin | — |
| Example 15 | — | — | Partially oxidized polyethylene wax (Acid value: 3) | Toluene | CdSe/ZnS core-shell quantum dot, hexadecyl amine | Silicone resin | — |
| Example 16 | — | — | Polyethylene wax (Acid value: 0) | Toluene | CdSe/ZnS core-shell quantum dot, hexadecyl amine | Silicone resin | — |
| Comparative Example 1 | CdSe/ZnS core-shell quantum dot, hexadecyl amine | Toluene | — | — | — | Epoxy diacrylate oligomer | — |
| Comparative Example 2 | CdSe/ZnS core-shell quantum dot, hexadecyl amine | Toluene | — | — | — | Silicone resin | — |

Figure 10:
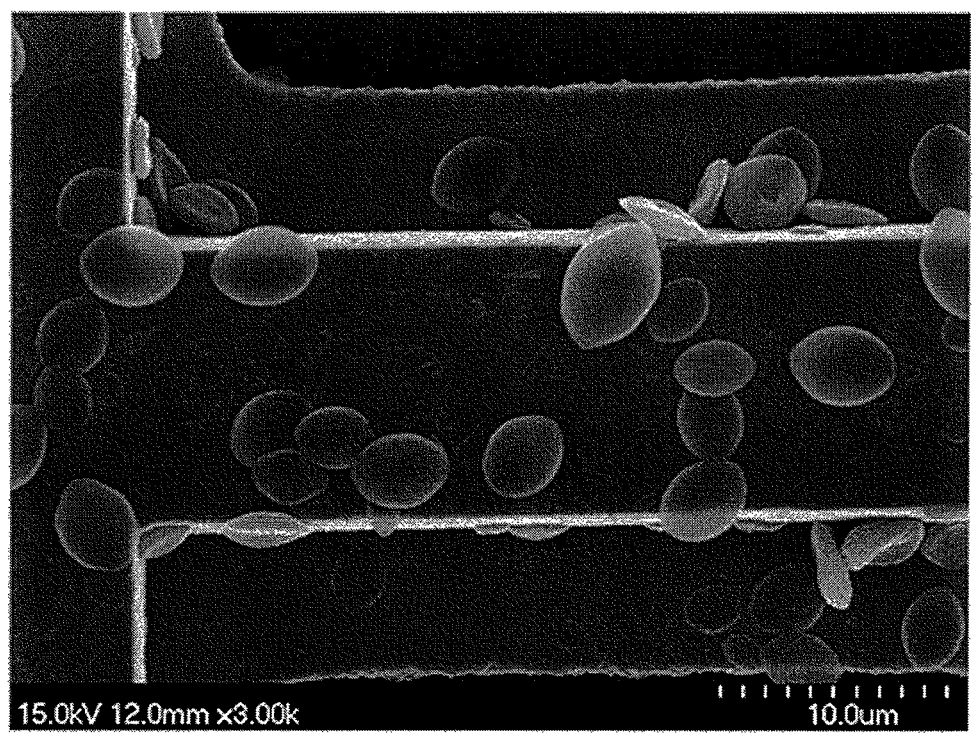
FIG. 10 is a scanning electron microscope (SEM) photograph taken after removing toluene from a polymer solution obtained according to Example 1.

FIG. 10 is a scanning electron microscope (SEM) photograph taken after removing toluene from the polymer solution obtained according to Example 1.

Referring to FIG. 10, the partially oxidized polyethylene wax produced polymer microparticles in the form of an ellipsoidal solid or an almond in a recrystallization process.

Figure 11:
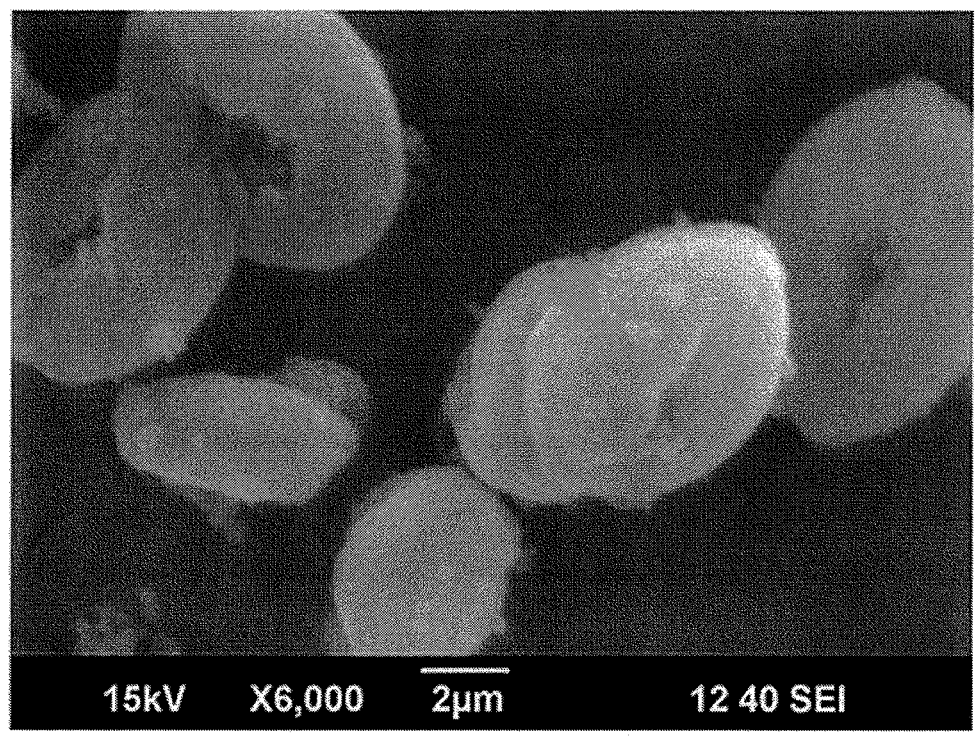
FIG. 11 is a SEM photograph of a result obtained according to Example 2.

FIG. 11 is a SEM photograph of the result obtained according to Example 2.

Referring to FIG. 11, inorganic passivation layers were formed on the polymer microparticles described in reference to FIG. 10. The inorganic passivation layer was a layer formed of silicon oxide particles.

Figure 12:
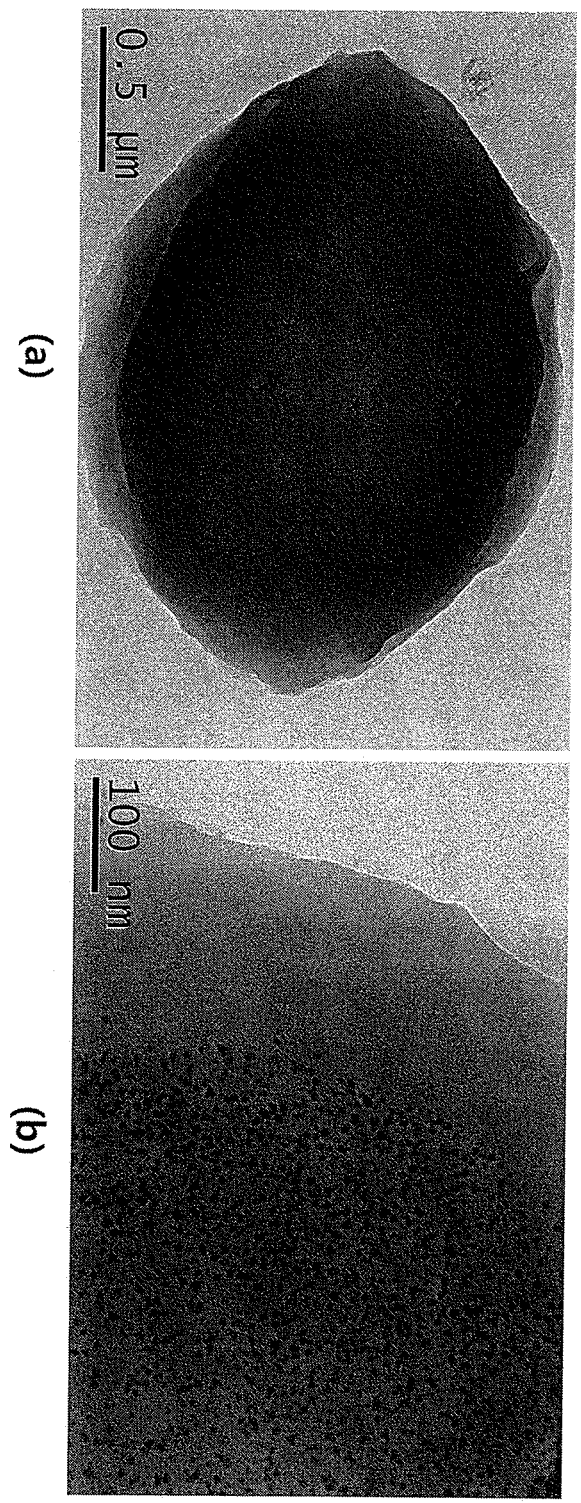
FIG. 12 is a transmission electron microscope (TEM) photograph of a result obtained according to Example 3.

FIG. 12 is a transmission electron microscope (TEM) photograph of the result obtained according to Example 3.

Referring to FIG. 12, microcapsular quantum dot-polymer composites in the form of an almond or an ellipsoidal solid were obtained (FIG. 12A). Here, in an enlarged photograph of an edge portion of a microcapsule, it was found that a pure polymer matrix with no quantum dot was disposed at a peripheral portion and surrounded quantum dots of the inner portion, while a plurality of quantum dots were uniformly dispersed and positioned in the inner portion (FIG. 12B).

Figure 13:
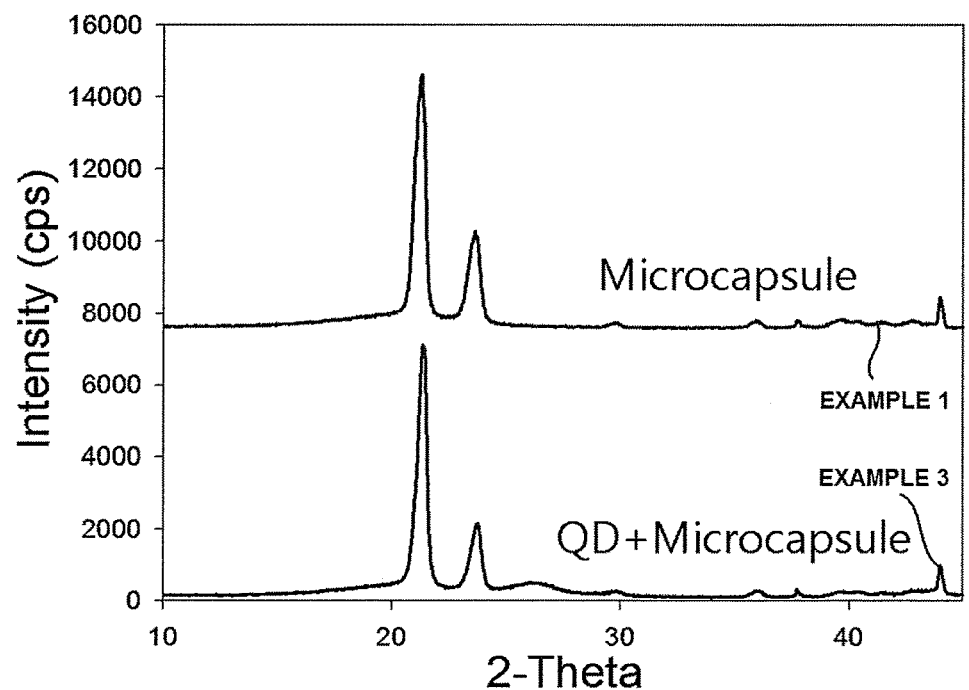
FIG. 13 is a graph showing X-ray diffraction (XRD) spectra of results obtained according to Example 1 and Example 3.

FIG. 13 is a graph showing X-ray diffraction (XRD) spectra of the results obtained according to Example 1 and Example 3.

Referring to FIG. 13, it was found that the polymer microparticles obtained according to Example 1 showed a typical spectrum of a crystal structure of polyethylene. Accordingly, crystallinity may be predicted to be about 67%. Further, the microcapsular quantum dot-polymer composites obtained according to Example 3 may also be seen to show substantially the same spectrum as the polymer microparticles obtained according to Example 1. Accordingly, an inner structure of the microcapsular quantum dot-polymer composites obtained according to Example 3 may be predicted to be composed of quantum dots which are disposed between crystalline plates formed of polyethylene as described above in reference to FIGS. 3C and 3D.

Figure 14:
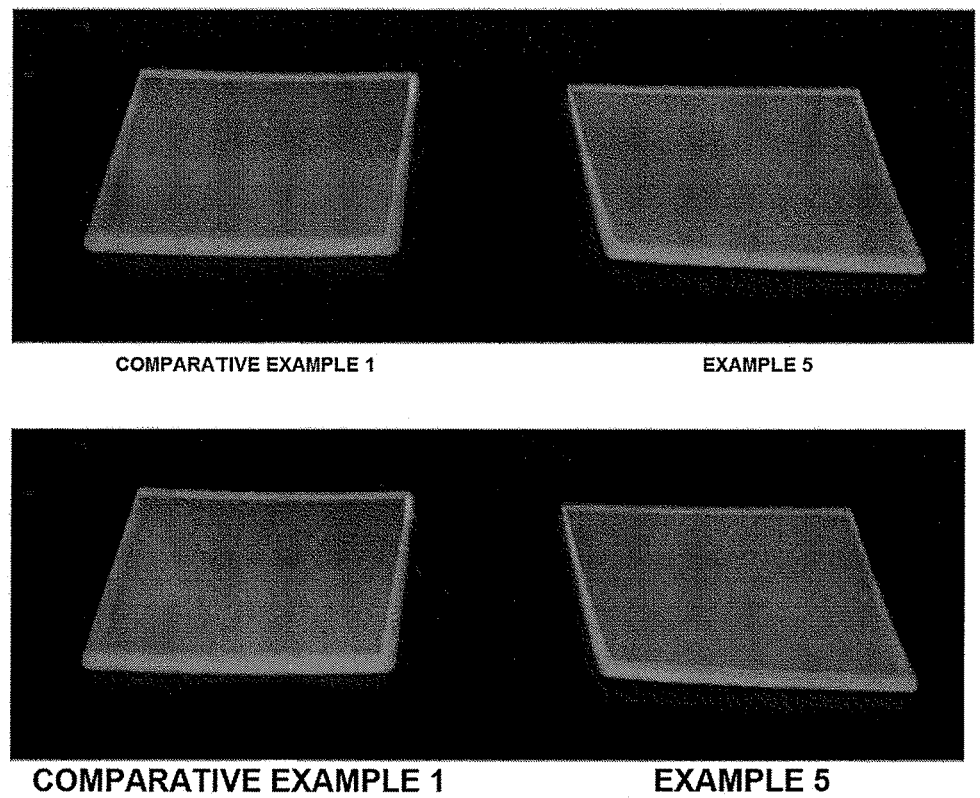
FIG. 14 shows photographs of optical devices fabricated in Comparative Example 1 and Example 5, which are optically taken under a UV lamp at a wavelength of 365 nm.

FIG. 14 is a photograph of optical devices fabricated in Comparative Example 1 and Example 5, which was taken optically under a UV lamp at a wavelength of 365 nm.

Referring to FIG. 14, it was found that an optical device of Example 5 shows more uniform coloring than the optical device of Comparative Example 1. In the case of Comparative Example 1, it is understood that the quantum dots in the epoxy resin were aggregated without being dispersed. However, in the case of Example 5, it is understood that uniform coloring was shown as the quantum dots were substantially uniformly dispersed in the microcapsule (i.e., in the polymer matrix), and the quantum dot-polymer composites were also substantially uniformly dispersed in the epoxy resin.

Figure 15:
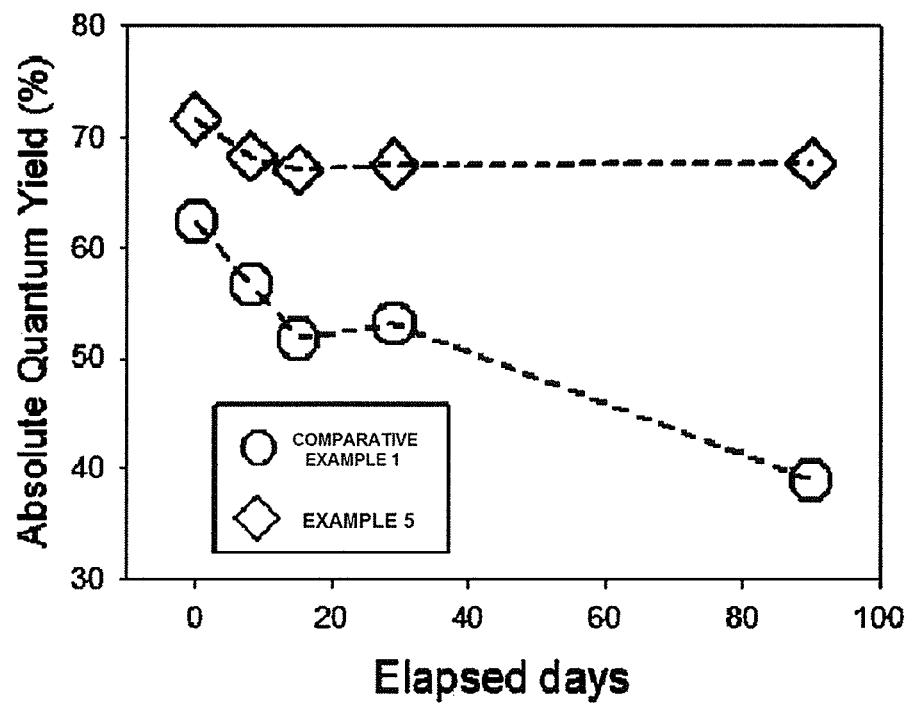
FIG. 15 is a graph showing absolute quantum yields of films according to the time elapsed after leaving optical devices fabricated in Comparative Example 1 and Example 5 at room temperature.

FIG. 15 is a graph showing absolute quantum yields of films according to the time elapsed after leaving the optical devices fabricated in Comparative Example 1 and Example 5 at room temperature.

Referring to FIG. 15, little change of absolute quantum efficiency as time passed was found in the optical device obtained according to Example 5. On the other hand, it was found that absolute quantum efficiency was rapidly decreased as time passed in the optical device obtained according to Comparative Example 1. In the case of Comparative Example 1, it was found that the quantum dots were damaged according to an elapsed time. However, in the case of Example 5, it was found that absolute quantum efficiency was maintained even after time had elapsed, because little damage to the quantum dots was generated due to humidity resistance of the polymer matrix, while the quantum dots were present in the polymer matrix.

Figure 16:
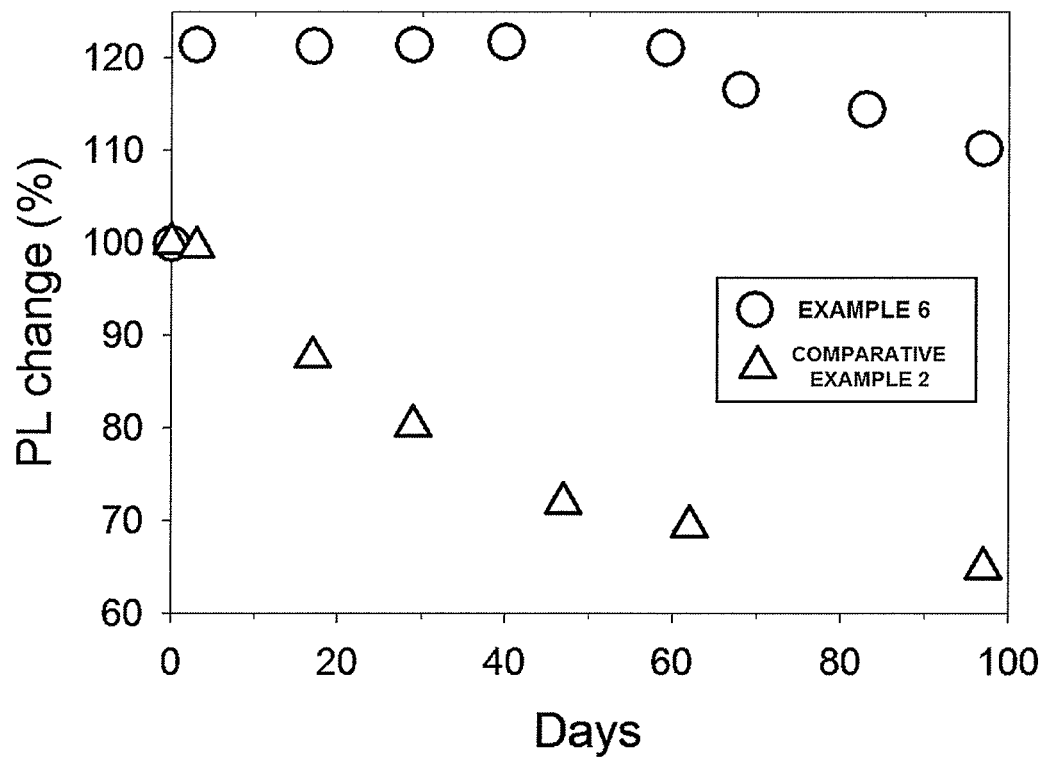
FIG. 16 is a graph showing a change of photoluminescence intensity according to the storage time after storing light emitting diodes fabricated in Comparative Example 2 and Example 6 in a thermo-hygrostat controlled to a temperature of 85° C. and a relative humidity of 85%.

FIG. 16 is a graph showing a change of photoluminescence (PL) intensity according to the storage time after storing the light emitting diodes fabricated in Comparative Example 2 and Example 6 in a thermo-hygrostat controlled to a temperature of 85° C. and a relative humidity of 85% and after determining PL intensity of the light emitting diodes using an LED luminous flux measurement device.

Referring to FIG. 16, little change of PL intensity was found according to the time elapsed in the light emitting diode obtained according to Example 6. On the other hand, it was found that PL intensity was rapidly decreased according to the time elapsed in the light emitting diode obtained according to Comparative Example 2. Hence, in the case of Comparative Example 2, it was found that the quantum dots were damaged according to an elapsed time due to moisture. However, in the case of Example 6, it is found that PL intensity was maintained even after time had elapsed, because little damage to the quantum dots was generated due to humidity resistance of the polymer matrix, while quantum dots were present in the polymer matrix.

Figure 17:
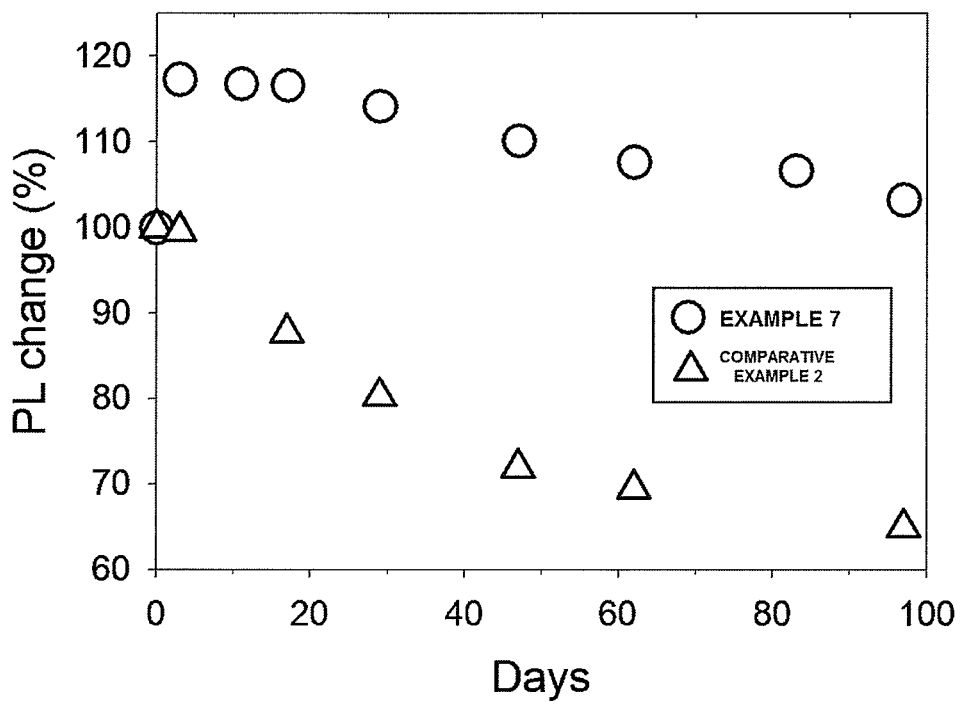
FIG. 17 is a graph showing a variation of photoluminescence intensity according to the storage time after storing light emitting diodes fabricated in Comparative Example 2 and Example 7 in a thermo-hygrostat controlled to a temperature of 85° C. and a relative humidity of 85%.

FIG. 17 is a graph showing a change of PL intensity according to the storage time after storing the light emitting diodes fabricated in Comparative Example 2 and Example 7 in a thermo-hygrostat controlled to a temperature of 85° C. and a relative humidity of 85%, and after determining PL intensity according to the storage time using an LED luminous flux measurement device.

Referring to FIG. 17, little change of PL intensity was found according to the time elapsed in the light emitting diode obtained according to Example 7. On the other hand, it was found that PL intensity was rapidly decreased according to the time elapsed in the light emitting diode obtained according to Comparative Example 2. This change tendency of PL intensity is similar to that of the light emitting diodes obtained according to Example 6 and Comparative Example 2 described in reference to FIG. 16. Therefore, in the case of Example 7, it is found that the quantum dots were present in the polymer matrix, and thus little damage to the quantum dots was generated due to humidity resistance of the polymer matrix, as in the case of Example 6.

However, referring to both of FIGS. 16 and 17, when a partially oxidized polyethylene wax had an acid value of 3 mgKOH/g (Example 7), it was found that PL intensity decreased in a shorter time than when a partially oxidized polyethylene wax had an acid value of 17 mgKOH/g (Example 6). However, the light emitting diode of Example 7 showed further higher PL intensity even after 10 days elapsed as compared to initial PL intensity (before the constant temperature and constant humidity test, day=0). Accordingly, it was found that a dispersion of quantum dots may be induced in a polymer matrix by effectively trapping the quantum dots even when the polymer matrix has an acid value of 3 mgKOH/g.

Figure 18:
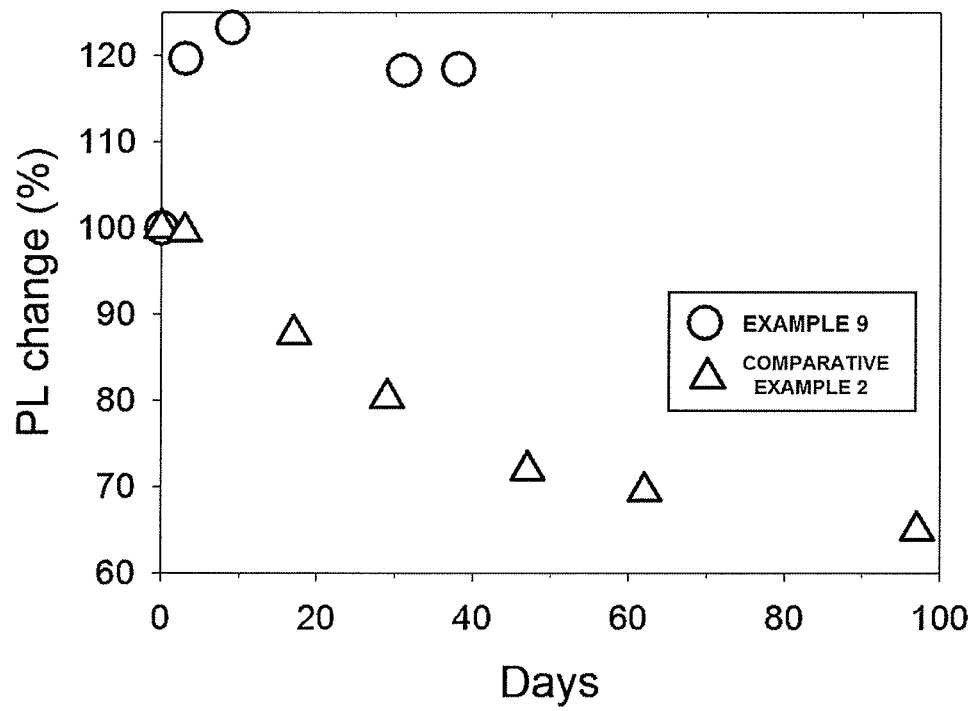
FIG. 18 is a graph showing a variation of photoluminescence intensity according to a storage time after storing light emitting diodes fabricated in Comparative Example 2 and Example 9 in a thermo-hygrostat controlled to a temperature of 85° C. and a relative humidity of 85%.

FIG. 18 is a graph showing a change of photoluminescence intensity according to a storage time after storing the light emitting diodes fabricated in Comparative Example 2 and Example 9 in a thermo-hygrostat controlled to a temperature of 85° C. and a relative humidity of 85%, and determining PL intensity according to a storage time using an LED luminous flux measurement device.

Referring to FIG. 18, little change of PL intensity was found according to the time elapsed in the light emitting diode obtained according to Example 9. On the other hand, it was found that PL intensity rapidly decreased according to the time elapsed in the light emitting diode obtained according to Comparative Example 2. This change tendency of PL intensity is similar to that of the light emitting diodes obtained according to Example 6, Example 7 and Comparative Example 2 described in reference to FIG. 16 and FIG. 17. Therefore, in the case of Example 9, it is found that the quantum dots were present in the polymer matrix, and thus little damage to the quantum dots was generated due to humidity resistance of the polymer matrix, as in the case of Example 6 and Example 7.

Referring to both FIG. 16 and FIG. 18, when the partially oxidized polypropylene wax having an acid value of 37 mgKOH/g (Example 9) was used, substantially similar change of PL intensity was found as compared to a case in which the partially oxidized polyethylene wax having an acid value of 17 mgKOH/g was used. Hence, it may be understood that the partially oxidized polypropylene wax may also effectively trap quantum dots similar to a partially oxidized polyethylene wax.

Figure 19:
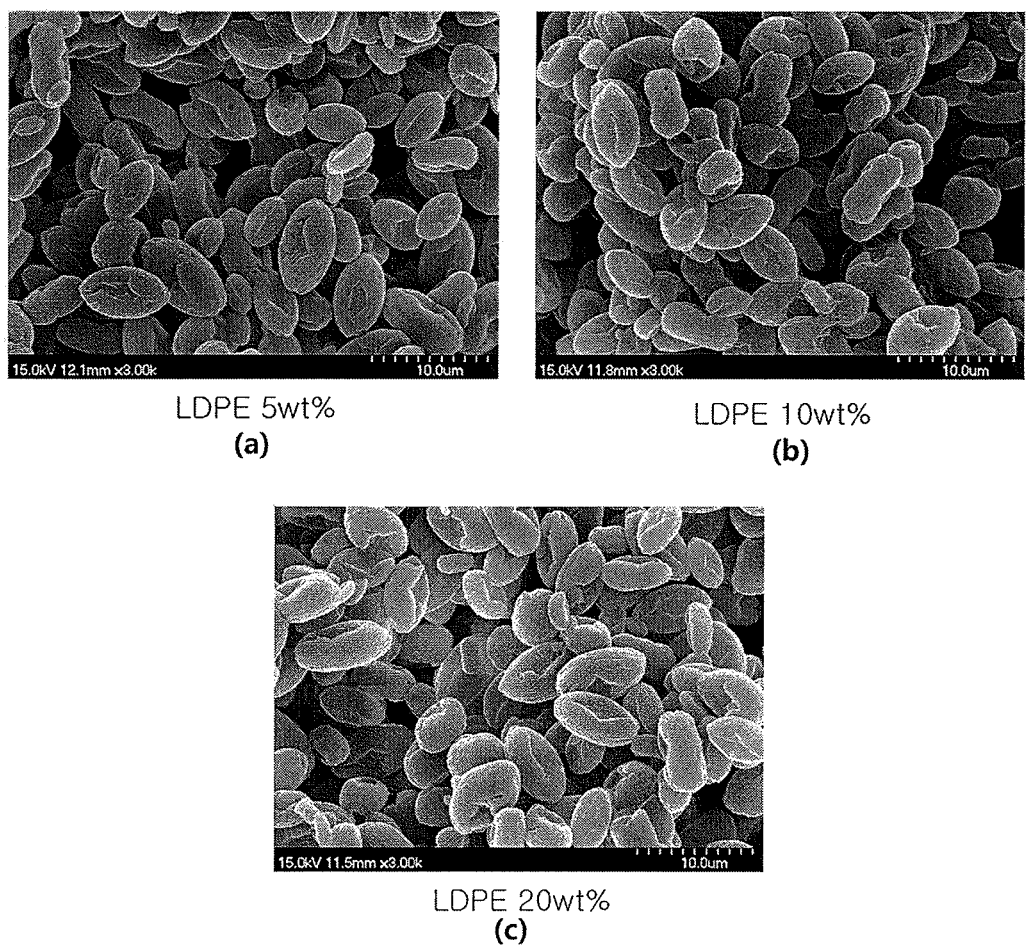
FIGS. 19 and 20 are SEM photographs of polymer microparticles obtained according to Example 10 and Example 11, respectively.
Figure 20:
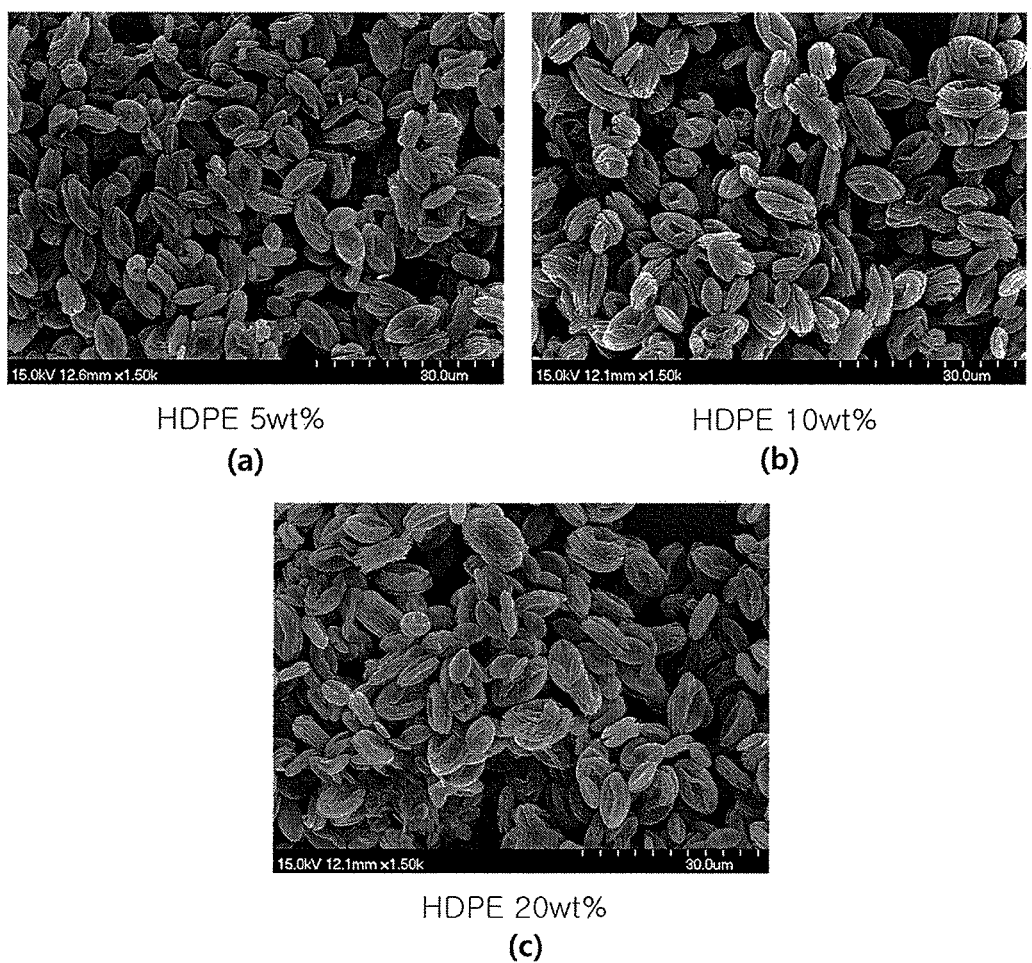

FIGS. 19 and 20 are SEM photographs of the polymer microparticles obtained according to Example 10 and Example 11, respectively.

Referring to FIGS. 19 and 20, it was found that the polymer microparticles in the form of an ellipsoidal solid or an almond may be obtained even when the LDPE or the HDPE was added to the polymer solution. It was found that there was less change in the shape of the polymer microparticles when the LDPE or the HDPE was added to the polymer solution than when the LDPE or the HDPE was not added to the polymer solution (FIG. 10, Example 1). However, it may be seen that a thickness of the particles was slightly increased when the LDPE was added to the polymer solution (FIG. 19). Further, it was found that a surface of a side part of the particles was slightly rough when the HDPE was added to the polymer solution (FIG. 20). It is presumed that this result is attributed to the high crystallinity of the HDPE, but the present invention is not limited by this theory.

Figure 21:
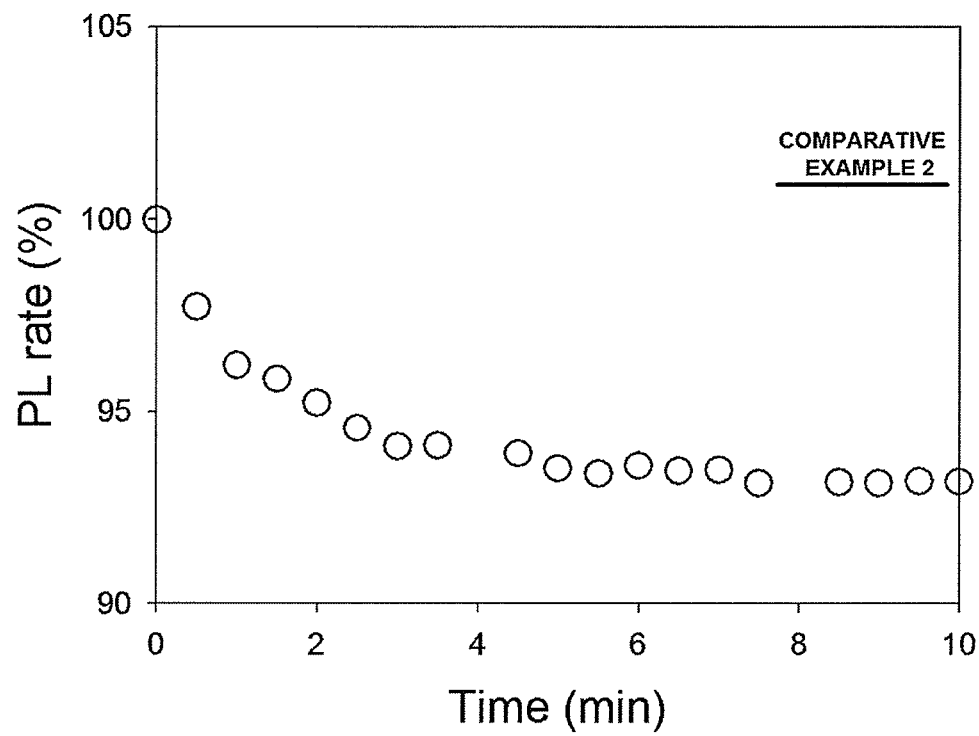
FIGS. 21, 22, and 23 are graphs showing a photoluminescence rate according to an operating time of light emitting diodes obtained according to Comparative Example 2, Example 6, and Example 13, respectively.
Figure 22:
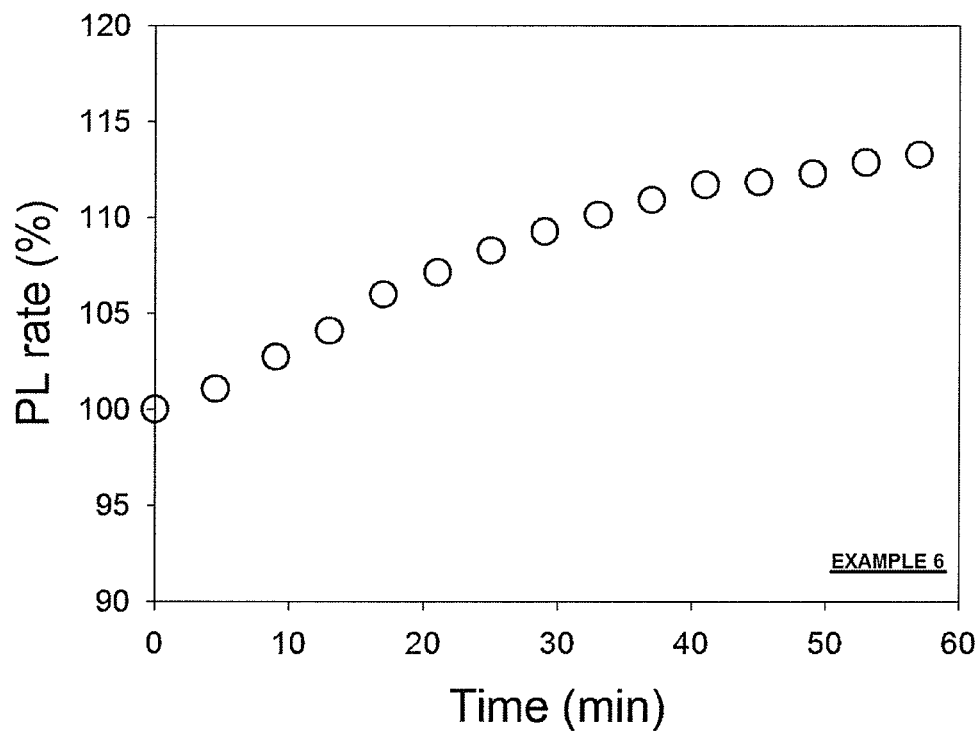
Figure 23:
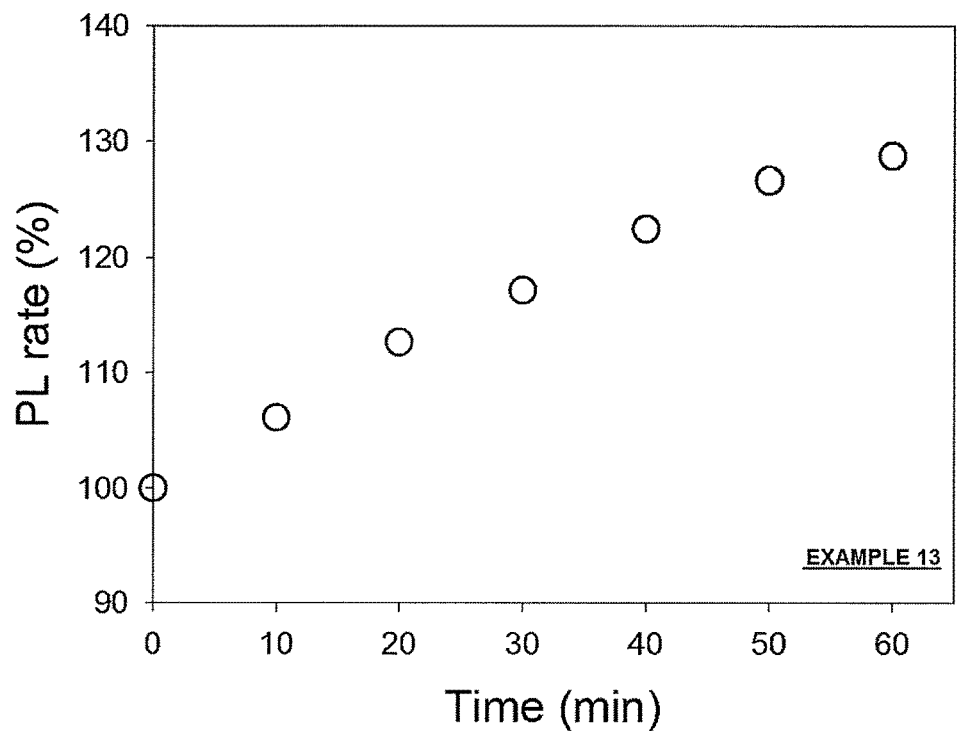

FIGS. 21, 22, and 23 are graphs showing a photoluminescence rate according to an operating time of the light emitting diodes obtained according to Comparative Example 2, Example 6, and Example 13, respectively. Here, the light emitting diodes operated under conditions of 3.2 V and 60 mA, and the photoluminescence rate was measured using an LED luminous flux measurement device. A ratio of the photoluminescence rate was measured based on an initial photoluminescence rate.

Referring to FIGS. 21, 22, and 23, it was found that photoluminescence significantly decreased immediately after operation of the light emitting diode in the case of Comparative Example 2 in which the quantum dots were not surrounded by a polymer matrix (FIG. 21). However, it was found that photoluminescence tended to increase from the initial photoluminescence rate of the light emitting diode in the case of Example 6 in which the quantum dot-polymer composites having quantum dots surrounded by a polymer matrix were applied (FIG. 22). Further, it was found that photoluminescence also tended to increase from the initial photoluminescence rate of the light emitting diode in the case of Example 13 in which quantum dot-polymer composites having quantum dots surrounded by a polymer matrix including the HDPE were applied (FIG. 22).

The following Table 2 shows photoluminescence rates obtained by measuring luminance properties after operating the light emitting diodes according to Comparative Example 2, Example 6, Example 12, and Example 13 under conditions of room temperature, 3.2 V, and 60 mA. The photoluminescence was measured using an LED luminous flux measurement device. The photoluminescence rate was calculated based on an initial photoluminescence.

TABLE 2

| | Comparative Example 2 | Example 6 | Example 12 | Example 13 |
|---|---|---|---|---|
| Number of operating days (days) | 7 | 6 | 8 | 8 |
| Photoluminescence rate (%) | 37 | 74 | 96 | 97 |

Referring to Table 2, in the case of Comparative Example 2 in which the quantum dots were not surrounded by the polymer matrix, photoluminescence decreased by 63% after 7 days of operating. This is understood to indicate that the quantum dots were damaged by heat of hundreds of degrees, for example, heat in a range of about 100 to about 150° C., which was generated upon operation of the light emitting diode.

In the case of Example 6 in which the quantum dot-polymer composites having quantum dots surrounded by a polymer matrix were applied, photoluminescence was decreased by 26% after 6 days of operating, but this is understood to be a great improvement over Comparative Example 2. Further, in each case of Example 12 and Example 13 in which the quantum dot-polymer composites having quantum dots surrounded by polymer matrices including the LDPE and the HDPE were applied, a photoluminescence was decreased by only 4% and 3%, respectively, after 8 days of operating.

Accordingly, it was found that the probability of damage to quantum dots due to heat generated by light emitting diodes may be decreased when the quantum dot-polymer composites having quantum dots surrounded by a polymer matrix were formed. In addition, when a high-molecular-weight polymer such as an LDPE or an HDPE was contained in a polymer matrix, it may be understood that the probability of damage to quantum dots due to heat may be further decreased. It was determined that flowability of the polymer matrix at a high temperature is decreased by the LDPE (melt index of about 50 g/min) and the HDPE (melt index of about 18 g/min), and thus a shape of the quantum dot-polymer composite may be maintained even at a high temperature, and consequently, damage to quantum dots is suppressed. However, the present invention is not limited by this theory.

FIGS. 24A, 25A, 26A, and 27A are each graphs showing radiant intensity per wavelength according to a storage time under high temperature and high humidity conditions of light emitting diodes according to Comparative Example 2, Example 16, Example 15, and Example 14, respectively. FIGS. 24B, 25B, 26B, and 27B are graphs showing photoluminescence rates according to a storage time under high temperature and high humidity conditions of the light emitting diodes according to Comparative Example 2, Example 16, Example 15, and Example 14, respectively. Here, after storing the light emitting diodes in a thermo-hygrostat controlled to a temperature of 85° C. and a relative humidity of 85%, PL intensities of the light emitting diodes were measured using an LED luminous flux measurement device. The photoluminescence rate was measured based on an initial PL intensity.

Figure 24A:
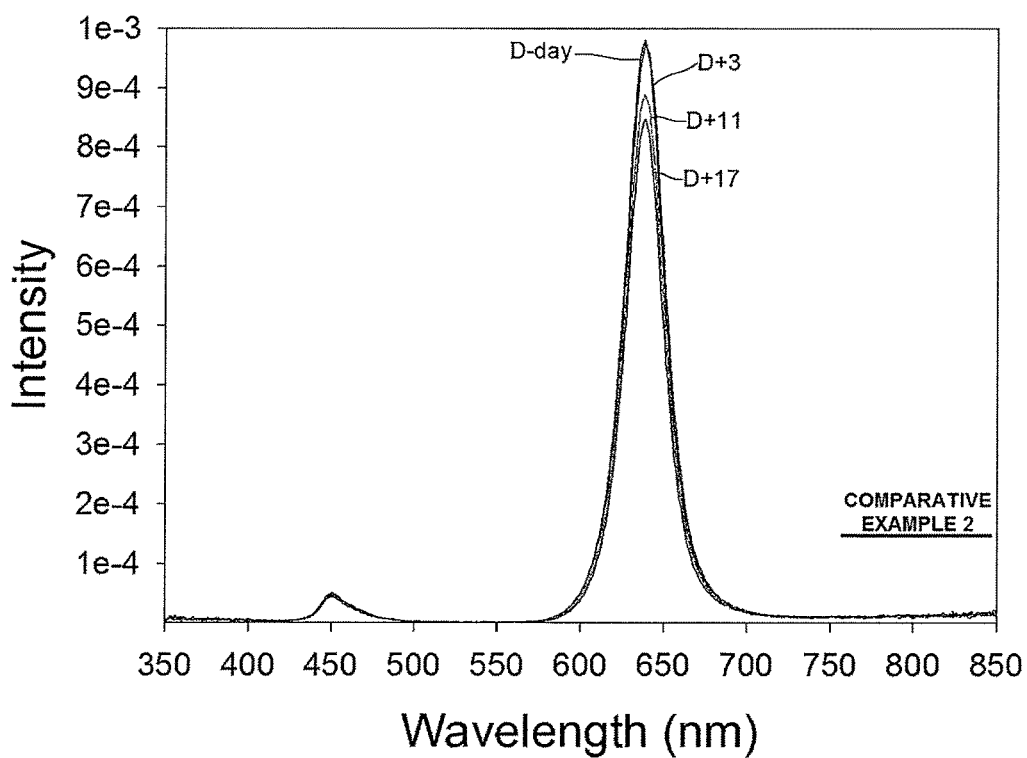
FIGS. 24A, 25A, 26A, and 27A are graphs showing spectral intensity distribution according to a storage time under high temperature and high humidity conditions of light emitting diodes fabricated according to Comparative Example 2, Example 16, Example 15, and Example 14, respectively.
Figure 24B:
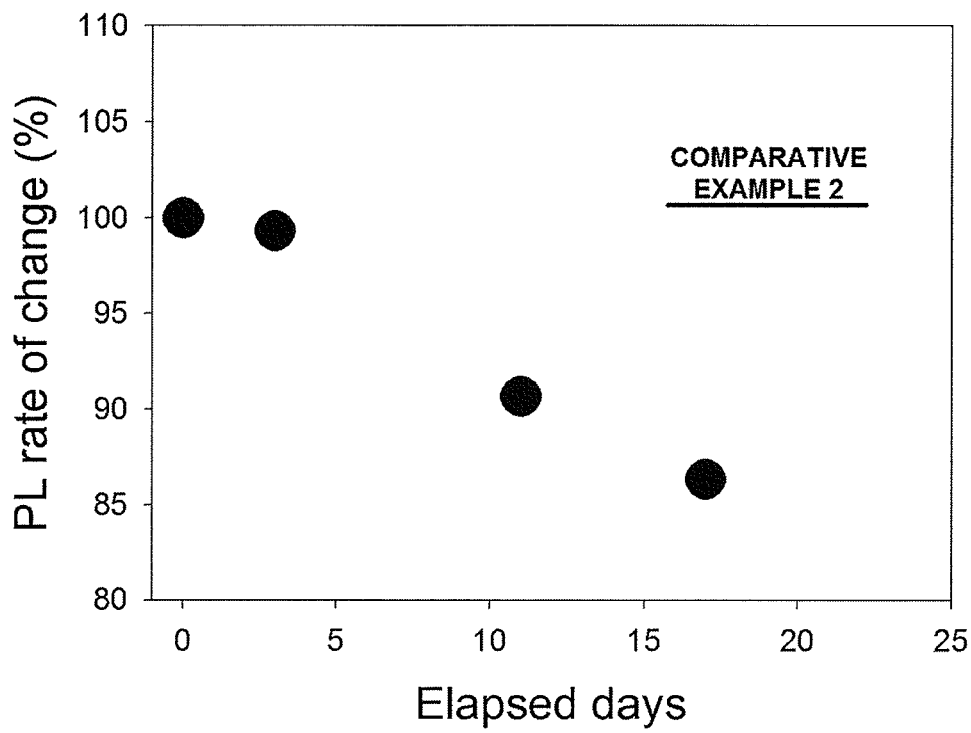
FIGS. 24B, 25B, 26B, and 27B are graphs showing a photoluminescence rate according to a storage time under high temperature and high humidity conditions of light emitting diodes fabricated according to Comparative Example 2, Example 16, Example 15, and Example 14.

Referring to FIGS. 24A and 24B, given that the intensity of blue light having a wavelength of 460 nm generated from the light emitting diode itself was maintained according to the storage time, it was found that an amount of blue light absorbed by the quantum dots was maintained uniformly. However, it was found that the intensity of red light having a wavelength of 630 nm generated due to light conversion of the quantum dots was gradually decreased as the storage time under conditions of high temperature and high humidity was prolonged. It was found that the intensity of red light was decreased by about 14% from an initial state after about 17 days had passed.

This suggests that light conversion efficiency of the quantum dots is significantly reduced under high temperature and high humidity conditions when polymer microparticles are not added to a photoelectric conversion layer.

Figure 25A:
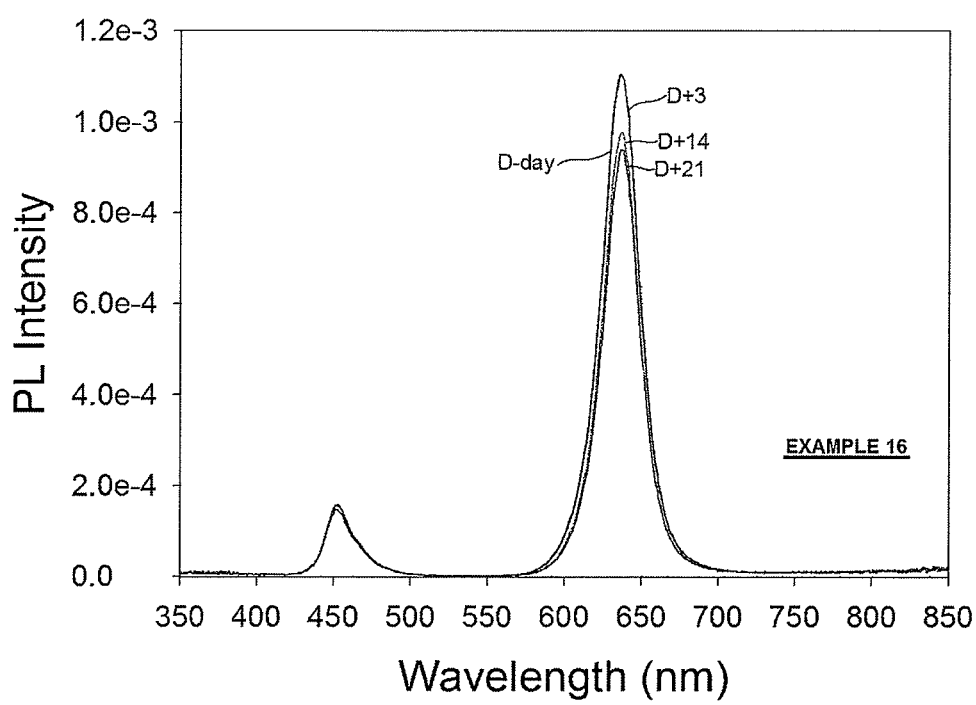
Figure 25B:
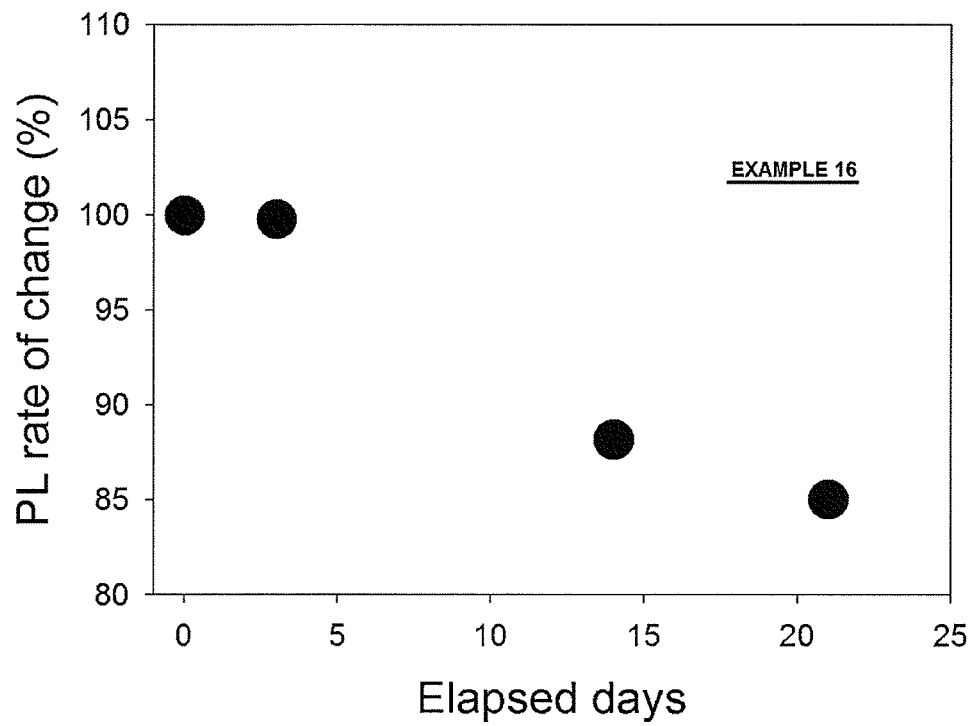
Figure 26A:
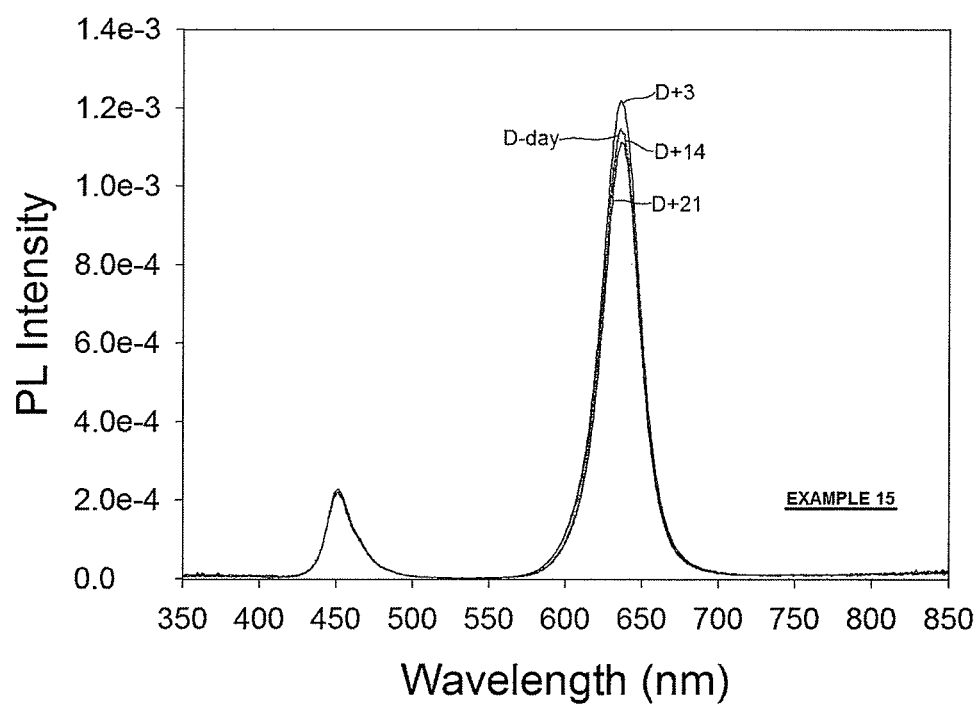
Figure 26B:
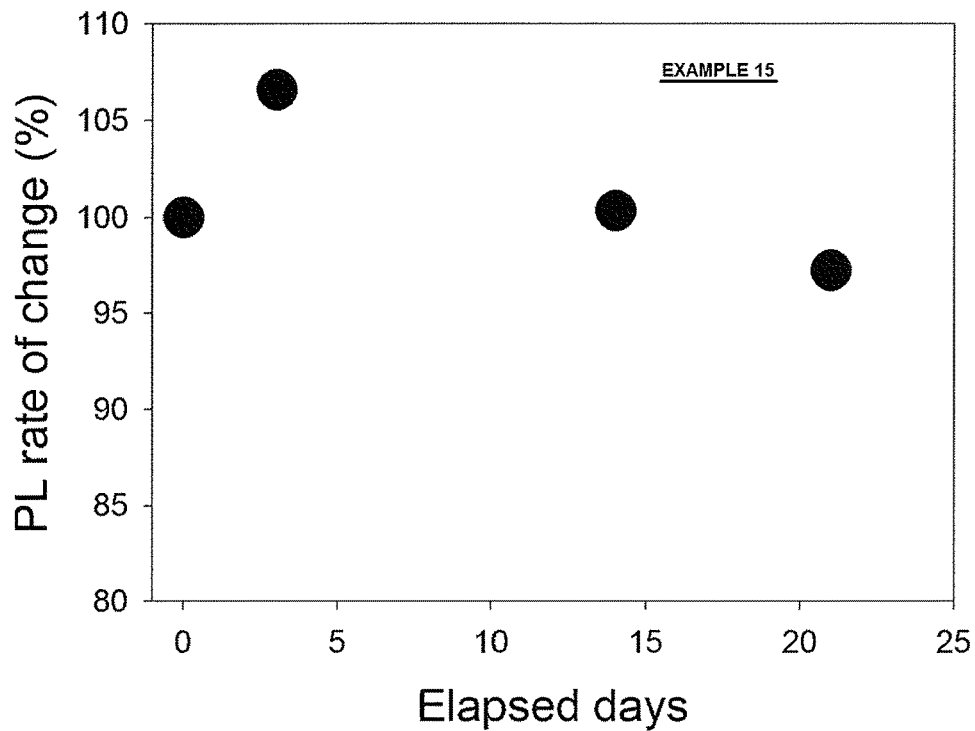
Figure 27A:
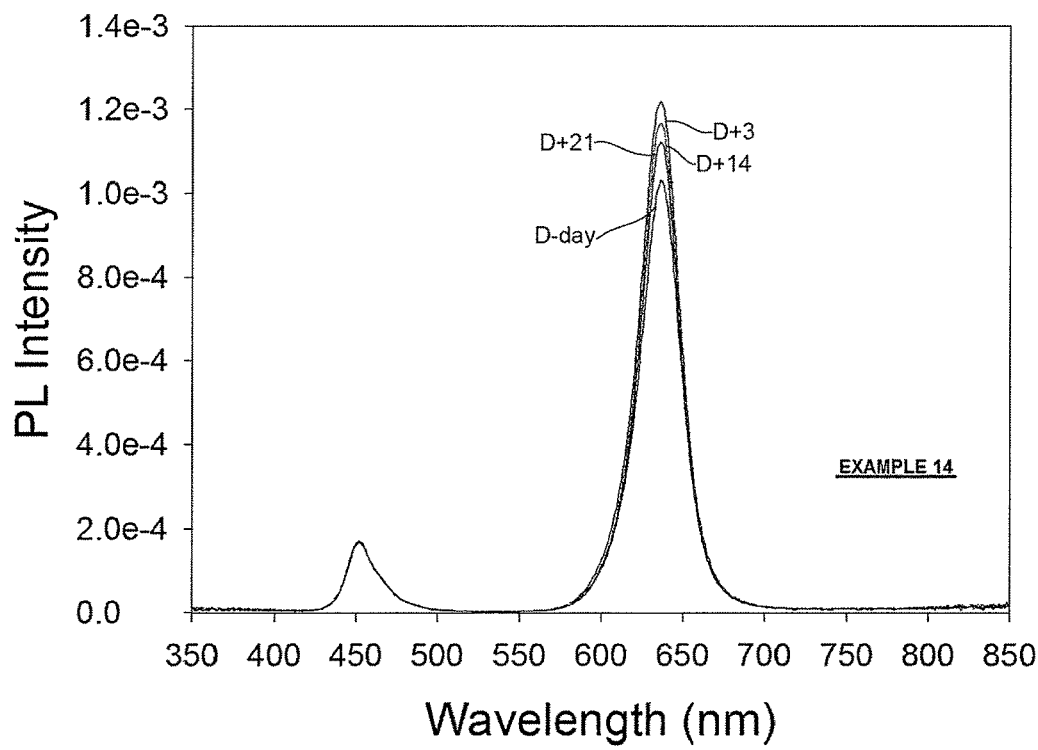
Figure 27B:
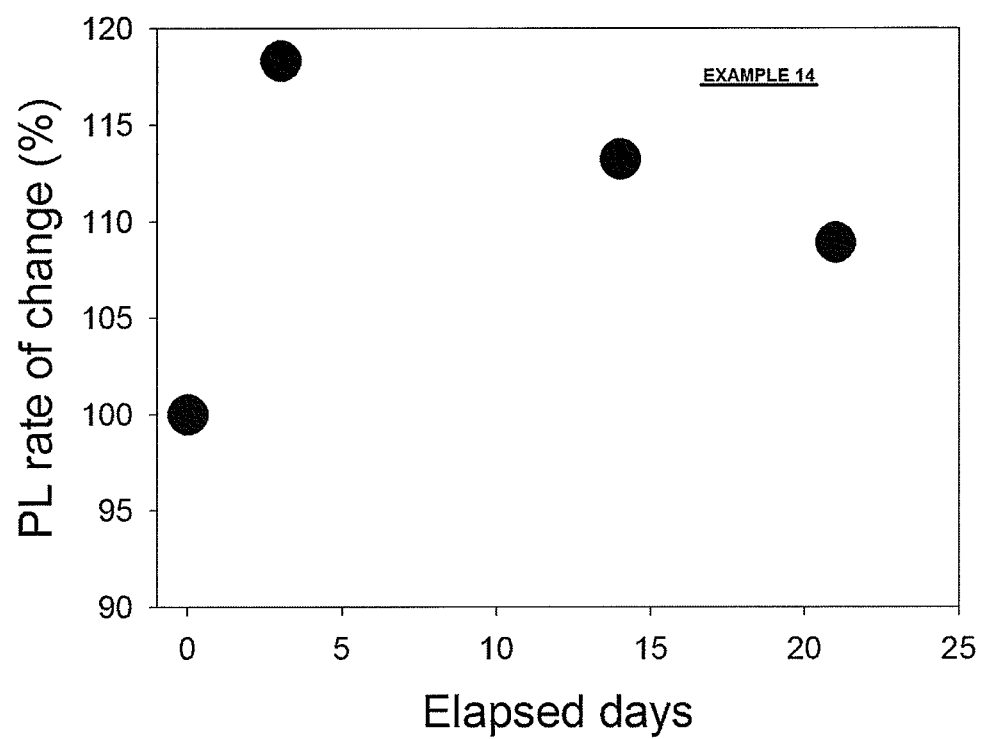

Referring to FIG. 25A and FIG. 25B, the intensity of red light, in other words, the photoluminescence was decreased by about 15% from an initial state after the light emitting diodes were stored for about 21 days under conditions of high temperature and high humidity.

Given that the time at which a photoluminescence started to decrease was slightly delayed compared to Comparative Example 2 (FIGS. 24A and 24B), it was found that the case in which the polymer microparticles produced using the polyethylene wax having an acid value of 0 mgKOH/g were added to the photoelectric conversion layer (Example 16 and FIGS. 25A and 25B) shows little improvement in light conversion efficiency of the quantum dots compared to the case in which polymer microparticles were not added to the photoelectric conversion layer (Comparative Example 2 and FIGS. 24A and 24B). The improvement may be attributed to an increase in humidity resistance of the photoelectric conversion layer when the polymer microparticles were included in the photoelectric conversion layer. However, an improvement level is not so high, and this is understood to be because the polyethylene wax having an acid value of 0 mgKOH/g hardly includes a polar functional group in a side chain, and the polymer microparticles formed from the polyethylene wax did not effectively absorb a quantum dot onto its surface accordingly.

Referring to FIGS. 26A, 26B, 27A, and 27B, when the polymer microparticles were prepared using the partially oxidized polyethylene wax having an acid value of 3 mgKOH/g (Example 15 and FIGS. 26A and 26B), it was found that photoluminescence decreased by about 3% after storing the light emitting diodes for about 21 days under conditions of high temperature and high humidity. Further, when the polymer microparticles were prepared using the partially oxidized polyethylene wax having an acid value of 17 mgKOH/g (Example 14 and FIGS. 27A and 27B), it was found that photoluminescence was increased by about 9% even after storing the light emitting diodes for about 21 days under conditions of high temperature and high humidity.

These results suggest that preparing the polymer microparticles using the partially oxidized polyethylene wax (Examples 14 and 15) may greatly suppress a decrease in photoluminescence under high temperature and high humidity conditions as compared to the case in which polymer microparticles were not added to the photoelectric conversion layer (Comparative Example 2 and FIGS. 24A and 24B) or the case in which polymer microparticles prepared using the polyethylene wax having an acid value of 0 mgKOH/g were added to the photoelectric conversion layer (Example 16 and FIGS. 25A and 25B). This is understood to be because the polymer microparticles may absorb the quantum dots on their surfaces as described above, and thus the quantum dots may be protected from moisture when the polymer microparticles are prepared using a polymer having a polar functional group in a side chain.

In addition, it was found that the light emitting diodes according to Examples 14 to 16 had an initial intensity of red light of about 1 $e^{-3}$ (relative value measured by measuring device, before correction) which was significantly enhanced compared to the light emitting diode in accordance to Comparative Example 2. These results are attributed to an increase in dispersibility of the quantum dots as the polymer microparticles were added in the photoelectric conversion layer. Especially, when the polymer having a polar functional group in the side chain was used, the quantum dots were seen to be absorbed onto the surface of the polymer microparticles, and thus dispersibility of quantum dots was further increased.

According to embodiments of the present invention, in a process of cooling a mixed solution of a polymer solution and a quantum dot suspension, when polymers form microcapsules through self-assembling, polar functional groups positioned in side chains of the polymers may increase interaction with quantum dots, and thus, the quantum dots may be captured in a polymer matrix or a self-assembled structure, and at the same time, the quantum dots may also be dispersed and positioned stably. Also, the polymer matrix in a microcapsular quantum dot-polymer composite may protect the quantum dots from an oxidizing environment such as oxygen or moisture, and from high temperature conditions. Furthermore, the microcapsules may be dispersed easily in various polymer or resin solutions, and various polymer or resin melts, and thus dispersibility may be maintained even after removing a solvent, cooling, or curing. As a result, quantum efficiency may be maintained stably for a long term.

Further, in addition to a polymer having a polar functional group in a side chain, a high-molecular-weight polymer having a higher average molecular weight than this polymer may be further added, and thus, damage to quantum dots due to heat may be suppressed, and thermal resistance or thermal stability of the quantum dot-polymer composite may be improved.

Although the present invention has been described above in detail in conjunction with the exemplary embodiments, it is understood that the present invention should not be limited to these exemplary embodiments but various changes and modifications can be made by one ordinary skilled in the art within the spirit and scope of the present invention as hereinafter claimed.

What is claimed is:

1. A composite particle comprising:
a particle body having a length in a range of 1-20 μm,
wherein the particle body comprises a polymer-containing matrix and semiconductive nanoparticles dispersed in the polymer-containing matrix,
wherein the polymer-containing matrix comprises a plurality of laminated plates that comprise a crystalline polymer material,
wherein at least part of the semiconductive nanoparticles are interposed between two immediately neighboring ones of the plurality of laminated plates such that some semiconductive particles are separated from other semiconductive nanoparticles by at least one intervening plate of the plurality of laminated plates in the polymer-containing matrix.

2. The composite particle of claim 1, wherein the plurality of laminated plates provides multiple inter-plate gaps, each of which is defined between two immediately neighboring ones of the plurality of laminated plates, wherein at least part of the semiconductive nanoparticles are distributed in each inter-plate gap.

3. The composite particle of claim 1, wherein an individual one of the semiconductive nanoparticles comprises a single-layered structure or multilayered structure.

4. The composite particle of claim 3, wherein the individual semiconductive nanoparticle comprises at least one selected from the group consisting of CdS, CdO, CdSe, CdTe, ZnS, ZnO, ZnSe, ZnTe, MnS, MnO, MnSe, MnTe, MgO, MgS, MgSe, MgTe, CaO, CaS, CaSe, CaTe, SrO, SrS, SrSe, SrTe, BaO, BaS, BaSe, BaTe, HgO, HgS, HgSe, HgTe, $Al_2O_3$, $Al_2S_3$, $Al_2Se_3$, $Al_2Te_3$, $Ga_2O_3$, $Ga_2S_3$, $Ga_2Se_3$, $Ga_2Te_3$, $In_2O_3$, $In_2S_3$, $In_2Se_3$, $In_2Te_3$, $SiO_2$, $GeO_2$, $SnO_2$, SnS, SnSe, SnTe, PbO, $PbO_2$, PbS, PbSe, PbTe, AlN, AlP, AlAs, AlSb, GaN, GaP, GaAs, GaSb, InN, InP, InAs, InSb, BP, Si, and Ge.

5. The composite particle of claim 3, wherein the individual semiconductive nanoparticle comprises a capping layer over a semiconductive material, wherein the capping layer configured for inhibiting the semiconductive nanoparticles from aggregating.

6. The composite particle of claim 5, wherein the capping layer comprises at least one selected from the group consisting of tri-n-octylphosphine oxide (TOPO), stearic acid, palmitic acid, octadecylamine, hexadecylamine, dodecylamine, lauric acid, oleic acid, and hexylphosphonic acid.

7. The composite particle of claim 1, wherein the semiconductive nanoparticles comprise quantum dots.

8. The composite particle of claim 1, wherein the particle body is generally ellipsoidal.

9. The composite particle of claim 1, wherein the particle body has a thickness in a range of 100 nm to 2 μm.

10. The composite particle of claim 1, further comprising an amorphous polymer material interposed between two immediately neighboring ones of the plurality of laminated plates.

11. The composite particle of claim 1, wherein the crystalline polymer material comprises at least one of a polyolefin wax and a polyolefin- polymaleic anhydride copolymer wax.

12. The composite particle of claim 1, wherein the crystalline polymer material comprises a polyolefin comprising oxygen moieties in at least one of a main chain and side chains thereof.

13. The composite particle of claim 12, wherein the oxygen moieties are selected from the group consisting of —OH, —COOH, —COH, —O— and —CO.

14. The composite particle of claim 12, wherein the polyolefin has a softening point in a range of 70° C. to 200° C.

15. The composite particle of claim 12, wherein the polyolefin has an acid value of 1 mgKOH/g to 100 mgKOH/g.

16. The composite particle of claim 1, further comprising a passivation layer formed on an outer surface of the composite particle.

17. The composite particle of claim 16, wherein the passivation layer comprises an inorganic material in the form of particles, wherein the inorganic material is selected from the group consisting of titanium oxide, silicon oxide and aluminum oxide.

18. An optical device comprising:
a substrate; and
an optical layer formed over the substrate and comprising the composite particle of claim 1 in plurality.

19. A light emitting device comprising:
a substrate;
a light source disposed on the substrate;
an optical layer formed over the substrate and further over the light source, wherein the optical layer comprises the composite particle of claim 1 in plurality.

20. A suspension comprising:
liquid; and
the composite particle of claim 1 in plurality dispersed in the liquid.

\* \* \* \* \*